US012730153B2

(12) United States Patent
Guo et al.

(10) Patent No.: US 12,730,153 B2
(45) Date of Patent: Sep. 8, 2026

(54) MAGNETIC FIELD-BASED DETECTION METHOD AND SYSTEM FOR CIRCUIT BREAKER SWITCHING OPERATION AND ARC DURATION DETECTION

(71) Applicant: GEORGIA TECH RESEARCH CORPORATION, Atlanta, GA (US)

(72) Inventors: Ning Guo, Atlanta, GA (US); Abdul Raheem Beyah, Atlanta, GA (US); Morris Cohen, Atlanta, GA (US); Lukas Graber, Atlanta, GA (US); Tohid Shekari, Atlanta, GA (US); Kevin Thomas Whitmore, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 104 days.

(21) Appl. No.: 18/834,842

(22) PCT Filed: Jan. 31, 2023

(86) PCT No.: PCT/US2023/012051
§ 371 (c)(1),
(2) Date: Jul. 31, 2024

(87) PCT Pub. No.: WO2023/147198
PCT Pub. Date: Aug. 3, 2023

(65) Prior Publication Data

US 2025/0164557 A1 May 22, 2025

Related U.S. Application Data

(60) Provisional application No. 63/304,982, filed on Jan. 31, 2022.

(51) Int. Cl.
*G01R 31/327* (2006.01)
*G01R 29/08* (2006.01)
*G01R 33/028* (2006.01)

(52) U.S. Cl.
CPC ..... *G01R 31/3274* (2013.01); *G01R 29/0807* (2013.01); *G01R 29/0878* (2013.01); *G01R 29/0892* (2013.01); *G01R 33/028* (2013.01)

(58) Field of Classification Search
CPC ........... G01R 31/3274; G01R 29/0807; G01R 29/0878; G01R 29/0892; G01R 33/028
See application file for complete search history.

(56) References Cited

U.S. PATENT DOCUMENTS

2010/0187916 A1 7/2010 Saito
2013/0229173 A1 9/2013 Bertrand
(Continued)

FOREIGN PATENT DOCUMENTS

WO WO-2020173795 A1 * 9/2020 ......... G01R 31/3274

OTHER PUBLICATIONS

A. A. Razi-Kazemi, M. Vakilian, K. Niayesh and M. Lehtonen, "Circuit-Breaker Automated Failure Tracking Based on Coil Current Signature," in IEEE Transactions on Power Delivery, vol. 29, No. 1, pp. 283-290, Feb. 2014, doi: 10.1109/TPWRD.2013.2276630. keywords: {Coils; Latches; Circuit breakers; Feature extraction;Vo.*

(Continued)

*Primary Examiner* — Stephanie E Bloss
*Assistant Examiner* — Michael A Harrison
(74) *Attorney, Agent, or Firm* — Meunier Carlin & Curfman LLC

(57) ABSTRACT

A system of tracking load switching operations and fault clearing operations of at least one circuit breaker in a power circuit includes at least one coil antenna sensing changes in
(Continued)

a magnetic field around the coil antenna. The changes in the magnetic field induce corresponding changes to a current or voltage in the at least one coil antenna. A receiver is connected to the at least one coil antenna and receives the current or voltage. A computer is connected to the receiver and stores a data stream that corresponds to the changes in magnetic field around the at least one coil antenna. The computer uses the data stream to generate a plurality of characteristic magnetic field waveforms for the at least one circuit breaker. The computer assembles a low frequency magnetic signature for a respective circuit breaker from the characteristic magnetic field waveforms generated for the respective circuit breaker.

25 Claims, 16 Drawing Sheets

(56) References Cited

U.S. PATENT DOCUMENTS

2016/0103180 A1* 4/2016 Ricciuti ............ G01R 31/3274 702/65
2017/0131356 A1 5/2017 Boury

OTHER PUBLICATIONS

International Search Report and Written Opinion received in PCT/US2023/012051 mailed Apr. 27, 2023.
B. Feizifar and O. Usta, "Condition monitoring of circuit breakers: Current status and future trends," in 2017 IEEE International Conference on Environment and Electrical Engineering and 2017 IEEE Industrial and Commercial Power Systems Europe (EEEIC/I&CPS Europe), pp. 15, IEEE, 2017.
A. A. Razi-Kazemi and K. Niayesh, "Condition monitoring of high voltage circuit breakers: past to future," IEEE Transactions on Power Delivery, vol. 36, No. 2, pp. 740-750, 2020.
T. Cheng, W. Gao, W. Liu, and R. Li, "Evaluation method of contact erosion for high voltage sf6 circuit breakers using dynamic contact resistance measurement," Electric Power Systems Research, vol. 163, pp. 725-732, 2018.
M. Abdollah and A. A. Razi-Kazemi, "Intelligent failure diagnosis for gas circuit breakers based on dynamic resistance measurements," IEEE Transactions on Instrumentation and Measurement, vol. 68, No. 9, pp. 3066-3077, 2018.
G. Chen, M. Li, Q. Wang, X. Lu, S. Zhang, and D. Luo, "The contact erosion characteristics of sf6 circuit breaker based on dynamic resistance measurement method," Energy Reports, vol. 8, pp. 1081-1089, 2022.
H. F. dos Santos Sousa, A. Costa de Oliveira, G. V. Rocha Xavier, H. Nunes de Santana, E. G. da Costa, and T. Vilela Ferreira, "Analysis of alternative parameters of dynamic resistance measurement in high voltage circuit breakers," High Voltage, vol. 4, No. 3, pp. 197-202, 2019.
M. Mohammadhosein, K. Niayesh, A. A. S. Akmal, and H. Mohseni, "Sensitivity of dynamic resistance of gas circuit breakers to the arcinduced contact erosion," in 2019 5th International Conference on Electric Power Equipment-Switching Technology (ICEPE-ST), pp. 3437, IEEE, 2019.
T. Takagi and H. Inoue, "Distribution of arc duration and material wear due to arc for ag, cu, and pd contacts," IEEE Transactions on Components, Hybrids, and Manufacturing Technology, vol. 2, No. 1, pp. 20-24,1979.
H. Sone and T. Takagi, "Role of the metallic phase arc discharge on arc erosion in ag contacts," IEEE transactions on components, hybrids, and manufacturing technology, vol. 13, No. 1, pp. 13-19, 1990.
J. Tepper, M. Seeger, T. Votteler, V. Behrens, and T. Honig, "Investigation on erosion of cu/w contacts in high-voltage circuit breakers," IEEE transactions on components and packaging technologies, vol. 29, No. 3, pp. 658-665, 2006.
S. Zhu, Y. Liu, B. Tian, Y. Zhang, and K. Song, "Arc erosion behavior and mechanism of cu/cr20 electrical contact material," Vacuum, vol. 143, pp. 129-137, 2017.
M. Mohammadhosein, K. Niayesh, A. A. Shayegani-Akmal, and H. Mohseni, "Online assessment of contact erosion in high voltage gas circuit breakers based on different physical quantities," IEEE Transactions on Power Delivery, vol. 34, No. 2, pp. 580-587, 2018.
M. Takashima, N. Yamamura, M. Hasegawa, Y. Watanae, and K. Sawa, "Investigations on mass change and surface morphology of contacts in electromagnetic contactor," in the Forty-Ninth IEEE Holm Conference on Electrical Contacts., pp. 84-90, IEEE, 2003.
K. Sawa, K. Yoshida, M. Watanabe, and K. Suzuki, "Arc characteristics and electrode mass change of agni contacts for electromagnetic contactors," in 2010 Proceedings of the 56th IEEE Holm Conference on Electrical Contacts, pp. 1-6, IEEE, 2010.
A. Bagherpoor, S. Rahimi-Pordanjani, A. A. Razi-Kazemi, and K. Niayesh, "Online condition assessment of interruption chamber of gas circuit breakers using arc voltage measurement," IEEE Transactions on Power Delivery, vol. 32, No. 4, pp. 1776-1783, 2016.
J. J. Shea, "Modeling contact erosion in three phase vacuum contactors," IEEE Transactions on Components, Packaging, and Manufacturing Technology: Part A, vol. 21, No. 4, pp. 556-564, 1998.
M. A. K. Pramanik, T. Takagi, and K. Mano, "A new method for the measurement and integration of arc durations in electrical contacts," IEEE Transactions on Instrumentation and Measurement, vol. 24, No. 2, pp. 188-193, 1975.
Z. Fu, W. Chen, Z. Li, L. Xiang, C. Li, K. Bian, L. Wang, and B. Liu, "Wear mechanism and mass loss characteristic of arcing contacts in sf6 circuit breaker in making process," IEEE Transactions on Components, Packaging and Manufacturing Technology, vol. 8, No. 9, pp. 1593-1603, 2018.
M. A. Chapman, Possibilities and limitations of radio-frequency measurement of arc duration in HVAC circuit breakers. PhD thesis, ETH Zurich, 2011.
T. Sidhu, G. Singh, and M. Sachdev, "Microprocessor based instrument for detecting and locating electric arcs," IEEE transactions on power delivery, vol. 13, No. 4, pp. 1079-1085, 1998.
A. Ukil, M. Zlatanski, and M. Hochlehnert, "Monitoring of hv generator circuit breaker contact ablation based on acoustic emission," IEEE Transactions on Instrumentation and Measurement, vol. 62, No. 10, pp. 2683-2693, 2013.
M. Chapman, "Radio-frequency-based determination of arcing duration in hvac circuit breakers," in CIRED 2005—18th International Conference and Exhibition on Electricity Distribution, pp. 1-5, IET, 2005.
M. Mohammadhosein, K. Niayesh, A. A. Shayegani Akmal, and H. Mohseni, "Online non-invasive evaluation of arcing time for condition assessment of high-voltage gas circuit breakers," IET Generation, Transmission & Distribution, vol. 15, No. 6, pp. 1013-1020, 2021.
J. Fayyad, M. A. Jaradat, D. Gruyer, and H. Najjaran, "Deep learning sensor fusion for autonomous vehicle perception and localization: A review," Sensors, vol. 20, No. 15, p. 4220, 2020.
J. Zhang, Y. Wu, Z. Xu, Z. Din, and H. Chen, "Fault diagnosis of high voltage circuit breaker based on multi-sensor information fusion with training weights," Measurement, vol. 192, p. 110894, 2022.
S. Qiu, H. Zhao, N. Jiang, Z. Wang, L. Liu, Y. An, H. Zhao, X. Miao, R. Liu, and G. Fortino, "Multi-sensor information fusion based on machine learning for real applications in human activity recognition: State-of-the-art and research challenges," Information Fusion, vol. 80, pp. 241-265, 2022.
M. B. Cohen, R. K. Said, E. W. Paschal, J. C. McCormick, N. C. Gross, L. Thompson, M. Higginson-Rollins, U. S. Inan, and J. Chang, "Broadband longwave radio remote sensing instrumentation," Review of Scientific Instruments, vol. 89, No. 9, p. 094501, 2018.

(56) References Cited

OTHER PUBLICATIONS

B. V. Gurses, K. T. Whitmore, and M. B. Cohen, "Ultra-sensitive broadband "awesome" electric field receiver for nanovolt low-frequency signals," Review of Scientific Instruments, vol. 92, No. 2, p. 024704, 2021.
Q. Yang, J. Ruan, Z. Zhuang, and D. Huang, "Condition evaluation for opening damper of spring operated high-voltage circuit breaker using vibration time-frequency image," IEEE Sensors Journal, vol. 19, No. 18, pp. 8116-8126, 2019.
Q. Yang, J. Ruan, and Z. Zhuang, "Fault diagnosis of circuit breakers based on time- frequency and chaotic vibration analysis," IET Generation, Transmission & Distribution, vol. 14, No. 7, pp. 1214-1221, 2020.
A. Korzhov, I. Okrainskaya, A. Sidorov, and V. Kufel'd, "A study of electromagnetic radiation of corona discharge near 500-kv electric installations," Power Technology and Engineering, vol. 38, pp. 57-60, 2004.
S. Kiranyaz, T. Ince, R. Hamila, and M. Gabbouj, "Convolutional neural networks for patient-specific ecg classification," in 2015 37th Annual International Conference of the IEEE Engineering in Medicine and Biology Society (EMBC), pp. 2608-2611, IEEE, 2015.
O. Abdeljaber, O. Avci, S. Kiranyaz, M. Gabbouj, and D. J. Inman, "Realtime vibration-based structural damage detection using one-dimensional convolutional neural networks," Journal of Sound and Vibration, vol. 388 , pp. 154-170, 2017.
L. Eren, T. Ince, and S. Kiranyaz, "A generic intelligent bearing fault diagnosis system using compact adaptive 1" "dcnn classifier," Journal of Signal Processing Systems, vol. 91, pp. 179-189, 2019.
X. Wang, D. Mao, and X. Li, "Bearing fault diagnosis based on vibroacoustic data fusion and 1d-cnn network," Measurement, vol. 173, p. 108518, 2021.
M. Jalil, F. A. Butt, and A. Malik, "Short-time energy, magnitude, zero crossing rate and autocorrelation measurement for discriminating voiced and unvoiced segments of speech signals," in 2013 The international conference on technological advances in electrical, electronics and computer engineering (TAEECE), pp. 208-212, IEEE, 2013.
R. W. Schafer and L. R. Rabiner, "Digital representations of speech signals," Proceedings of the IEEE, vol. 63, No. 4, pp. 662-677, 1975.
Y. Meng, S. Jia, Z. Shi, and M. Rong, "The detection of the closing moments of a vacuum circuit breaker by vibration analysis," IEEE transactions on power delivery, vol. 21, No. 2, pp. 652-658, 2006.
C.-C. Hsu, G. Frusque, M. Muratovic, C. M. Franck, and O. Fink, "Vacuum circuit breaker closing time key moments detection via vibration monitoring: A run-to-failure study," in 2022 IEEE International Conference on Systems, Man, and Cybernetics (SMC), pp. 254-260, IEEE, 2022.
M. Kim, K. Kim, A. Smajkic, M. Kapetanovic, and M. Muratovic, "Influence of contact erosion on the state of SF6 gas in interrupter chambers of HV SF6 circuit breakers," 2014 IEEE International Power Modulator and High Voltage Conference (IPMHVC), 2014, pp. 466-469.
Wang, Z. (2018). Study on the mechanisms and prediction methods of arcing contact erosion of high-voltage circuit breaker. Available from ProQuest Dissertations & Theses A ProQuest Dissertations & Theses Global (2333803975).
T. S. Sidhu, G. S. Sagoo, and M. S. Sachdev, "Multisensor secondary device for detection of low-level arcing faults in metal-clad MCC switchgear panel," IEEE Trans. Power Del., vol. 17, pp. 129-134, Jan. 2002.
T. S. Sidhu, G. S. Sagoo, and M. S. Sachdev, "On-line detection and location of low-level arcing in dry-type transformers," IEEE Trans. Power Del., vol. 17, pp. 135-141, Jan. 2002.
K. Jakob and W. Schels, "A new, intelligent digital arc detection system for air- and gas-insulated switchgear," in CIRED 97, vol. Conf. Publ. 438, Jun. 1997, pp. 1.32.1-1.32.5.
Rettenmaier, T., et al. "Investigations on contact erosion in vacuum circuit breakers by arc rotation measurements with external magnetic field sensors." 2012 25th International Symposium on Discharges and Electrical Insulation in Vacuum (ISDEIV). IEEE, 2012. pp. 149-152.
Rettenmaier, T., V. Hinrichsen, and E. Taylor. "Investigations on arc movement in vacuum interrupters by arc rotation measurements with external magnetic field sensors." 2014 International Symposium on Discharges and Electrical Insulation in Vacuum (ISDEIV). IEEE, 2012. pp 201-204.
C. Wang, R. Callan, A. Zajic, and M. Prvulovic, "An algorithm for finding carriers of amplitude-modulated electromagnetic emanations in computer systems," in IEEE 10th European Conf. on Antennas and Propag. (EuCAP), 2016, pp. 1-5.
M. Prvulovic, A. Zaji'c, R. L. Callan, and C. J. Wang, "A method for finding frequency-modulated and amplitude-modulated electromagnetic emanations in computer systems," IEEE Trans. Electromagn. Compat., vol. 59, No. 1, pp. 34-42, 2017.
C. Bayens, T. Le, L. Garcia, R. Beyah, M. Javanmard, and S. Zonouz, "See no evil, hear no evil, feel no evil, print no evil? malicious fill patterns detection in additive manufacturing," Proc. of the 26th USENIX Security Symp., pp. 1181-1198 (1-18), 2017.
Shekari, Tohid, et al. "RFDIDS: Radio Frequency-based Distributed Intrusion Detection System for the Power Grid." NDSS. 2019.
F. Si, C. Yundong, L. Kai, H. Chunguang and L. Jing, "Investigation on arcing behaviors in high-voltage switchgear with a rotary interruption technology," 2017 4th International Conference on Electric Power Equipment—Switching Technology (ICEPE-ST), 2017, pp. 616-619.
H. Janssen, V. Hinrichsen, E. D. Taylor and T. Rettenmaier, "Comparison of Arc Motion in Lifetime Sealed Vacuum Interrupters with Different Bottle Geometries," 2018 28th International Symposium on Discharges and Electrical Insulation in Vacuum (ISDEIV), 2018, pp. 263-266.
H. Janssen, V. Hinrichsen, E. D. Taylor and T. Rettenmaier, "Comparison of Arc Motion in Different Lifetime Sealed Vacuum Interrupters With RMF Contacts," in IEEE Transactions on Plasma Science, vol. 47, No. 8, pp. 3525-3532, Aug. 2019.
N. Guo, K. Whitmore, M. Cohen, T. Shekari, R. Beyah, and L. Graber, "Magnetic Signature of Vacuum Interrupters during Load Switching," In Press. IEEE 40th Electrical Insulation Conference 2022, Knoxville, TN, Jun. 19-23, 2022.
P. H. Roberts, An Introduction to Magnetohydrodynamics. London, United Kingdoms: Longmans, 1967.
K. Nitta et al., "Three-dimensional magnetic field analysis of electrodes for VCBs [vacuum circuit breakers]," in IEEE Transactions on Power Delivery, vol. 12, No. 4, pp. 1520-1525, Oct. 1997.
Yi Wu, Mingzhe Rong, Jian Li and Jianyong Lou, "Calculation of electric and magnetic fields in simplified chambers of low-voltage circuit breakers," in IEEE Transactions on Magnetics, vol. 42, No. 4, pp. 1007-1010, Apr. 2006.
J. Gonzalez, P. Freton, F. Reichert and D. Randrianarivao, "Turbulence and Magnetic Field Calculations in High-Voltage Circuit Breakers," in IEEE Transactions on Plasma Science, vol. 40, No. 3, pp. 936-945, Mar. 2012.
Y. Zhang, X. Yao, Z. Liu, Y. Geng and P. Liu, "Axial Magnetic Field Strength Needed for a 126-kV Single-Break Vacuum Circuit Breaker During Asymmetrical Current Switching," in IEEE Transactions on Plasma Science, vol. 41, No. 6, pp. 1670-1678, Jun. 2013.
L. Xiaozhao, Z. Yang, W. Yuhao, J. Lei and W. Zhengqi, "Magnetic Field Simulation Analysis of New Type Coil-type Axial Magnetic," 2020 IEEE International Conference on Advances in Electrical Engineering and Computer Applications(AEECA), 2020, pp. 337-340.
B. U. Musa, W. H. Siew and M. D. Judd, "Computation of Transient Electromagnetic Fields Due to Switching in High-Voltage Substations," in IEEE Transactions on Power Delivery, vol. 25, No. 2, pp. 1154-1161, Apr. 2010.
R. S. Shi, A. Darcherif and J. C. Sabonnadiere, "Computation of transient electromagnetic fields radiated by a transmission line: An exact model," in IEEE Transactions on Magnetics, vol. 31, No. 4, pp. 2423-2431, Jul. 1995.

(56) References Cited

OTHER PUBLICATIONS

A. Diamantis and A. G. Kladas, "Mixed Numerical Methodology for Evaluation of Low-Frequency Electric and Magnetic Fields Near Power Facilities," in IEEE Transactions on Magnetics, vol. 55, No. 6, pp. 1-4, Jun. 2019.
J. Gonos et al., "Environmental Impact Analysis of Electric Power Lines," 2018 IEEE International Conference on Environment and Electrical Engineering and 2018 IEEE Industrial and Commercial Power Systems Europe (EEEIC / I&CPS Europe), 2018, pp. 1-5.
N. Ari and W. Blumer, "Transient Electromagnetic Fields Due to Switching Operations in Electric Power Systems," in IEEE Transactions on Electromagnetic Compatibility, vol. EMC-29, No. 3, pp. 233-237, Aug. 1987.
M. Bosworth et al., "Modeling of Reaction Forces in High-Voltage Substation Structures," in IEEE Transactions on Power Delivery, vol. 33, No. 4, pp. 1510-1517, Aug. 2018.
M. A. Uman, D. K. McLain, and E. P. Krider, "The electromagnetic radiation from a finite antenna," in American Journal of Physics, vol. 43, No. 1, pp. 33-38, Jan. 1975.
B. Nekhoul, R. Feuillet, J. C. Sabonnadiere, L. Quinchon and F. Morillon, "Prediction of transient electromagnetic environment in power networks," in IEEE Transactions on Magnetics, vol. 30, No. 5, pp. 3745-3748, Sep. 1994.
M. Mohana Rao, M. J. Thomas and B. P. Singh, "Computation of EMI fields in a high voltage gas insulated substation during switching operations," 2003 IEEE Symposium on Electromagnetic Compatibility. Symposium Record (Cat. No.03CH37446), 2003, pp. 743-748.
J. Heberlein, J. Mentel, and E. Pfender, "The anode region of electric arcs: A survey," in Journal of Physics D: Applied Physics, vol. 43, No. 2. Dec. 2010.
C. W. Kimblin, "Anode voltage drop and anode spot formation in dc vacuum arcs," in Journal of Applied Physics, vol. 40, No. 4, pp. 1744-1752, Oct. 1969.
I. I. Beilis, "Vacuum Arc Cathode Spot Theory: History and Evolution of the Mechanisms," in IEEE Transactions on Plasma Science, vol. 47, No. 8, pp. 3412-3433, Aug. 2019.
P. G. Slade and M. D. Nahemow, "Initial Separation of Electrical Contacts Carrying High Currents," in Journal of Applied Physics, vol. 42, No. 9, pp. 3290-3297, 1971.
J. V. R. Heberlein and J. G. Gorman, "The High Current Metal Vapor Arc col. between Separating Electrodes," in IEEE Transactions on Plasma Science, vol. 8, No. 4, pp. 283-288, 1980.
P. Slade, "The Vacuum Interrupter Contact," in IEEE Transactions on Components, Hybrids, and Manufacturing Technology, vol. 7, No. 1, pp. 25-32, 1984.
R. Haug and T. Kouakou, "Phenomena preceding arc ignition between opening contacts: experimental study and theoretical approach," Thirty-Sixth IEEE Conference on Electrical Contacts, and the Fifteenth International Conference on Electrical Contacts, 1990, pp. 543-549.
M. Schulman, "Separation of spiral contacts and the motion of vacuum arcs at high AC currents," IEEE Transactions on Plasma Science, vol. 21, No. 5, pp. 484-488, 1993.
K. Watanabe, E. Kaneko, and S. Yanabu, "Technological progress of axial magnetic field vacuum interrupters," IEEE Transactions on Plasma Science, vol. 25, No. 4, pp. 609-616, 1997.
Y. Langlois, P. Chapelle, A. Jardy, and F. Gentils, "On the numerical simulation of the diffuse arc in a vacuum interrupter," in Journal of Applied Physics, vol. 109, No. 11, pp. 113306-01-113306-12, 2011.
Y. Niwa, R. Palad, K. Sasage and W. Sakaguchi, "Vacuum arc behavior in transversal magnetic field electrode of Vacuum Interrupter," 2012 25th International Symposium on Discharges and Electrical Insulation in Vacuum (ISDEIV), 2012, pp. 505-508.

* cited by examiner

MAGNETIC FIELD-BASED DETECTION METHOD AND SYSTEM FOR CIRCUIT BREAKER SWITCHING OPERATION AND ARC DURATION DETECTION

CROSS-REFERENCE TO RELATED APPLICATIONS

This application is a U.S. National Stage application claiming priority under 35 U.S.C. § 371 to PCT/US2023/012051 filed Jan. 31, 2023, which is incorporated by reference herein and which claims priority to and incorporates by reference U.S. Provisional Patent Application Ser. No. 63/304,982, filed on Jan. 31, 2022, and entitled Magnetic Field-Based Detection Method and System for Circuit Breaker Switching Operation and Arc Duration Detection.

GOVERNMENT LICENSE RIGHTS

This invention was made with government support under Grant No. 192580 awarded by the National Science Foundation. The government has certain rights in the invention.

BACKGROUND

Circuit breakers are one of the critical elements of a substation in a power distribution system, and they are responsible for controlling and protecting the power grid. However, in recent years, this important function of circuit breakers has been threatened by undesirable contact erosion and cyberattack. The undesirable contact erosion reduces significantly the arc quenching capability of the circuit breaker and thus decreases its lifetime, and cyberattacks perform malicious controls on circuit breakers to cause power outages without being discovered by the supervisory control and data acquisition system.

SUMMARY

In one implementation, an apparatus gathers magnetic field data associated with at least one circuit breaker connected to a power circuit. The apparatus includes at least one coil antenna positioned in a location relative to the at least one circuit breaker to sense changes in a magnetic field around the coil antenna, wherein the changes in the magnetic field induce corresponding changes to a current and voltage on the coil antenna. A receiver connected to the at least one coil antenna receives the current or the voltage from the coil antenna. An analog to digital converter receives the current or the voltage and generates a digital output tracking the changes to the current caused by the magnetic field around the coil antenna. A computer having a processor and computer memory is connected to the analog to digital converter and stores the digital output in the computer memory, wherein the computer memory accesses software implemented by the processor to generate a plurality of characteristic magnetic field waveforms of the magnetic field data for the at least one circuit breaker.

In another implementation, the coil antenna includes respective wire coils positioned to sense an x, y, or z component of the magnetic field around the coil antenna, and the computer generates, in the time domain, a designated waveform signature for a respective x, y, or z component of the magnetic field, and wherein the designated waveform signature comprises the plurality of characteristic magnetic field waveforms.

In another implementation, the respective x, y, or z component of the magnetic field induces changes to a corresponding current and a corresponding voltage on a respective wire coil according to changes in a power circuit current across the at least one circuit breaker during a load switching operation on the power circuit.

In another implementation, the plurality of characteristic magnetic field waveforms includes a spiking waveform, a notch waveform, and a second spiking waveform during a time period corresponding to a load switching operation across the at least one circuit breaker.

In another implementation, the spiking waveform includes an increase or a decrease in the magnetic field around the coil antenna, wherein the increase or decrease corresponds to changes in power circuit current across contacts of the at least one circuit breaker in a closed position.

In another implementation, the notch waveform comprises an increase or a decrease in the magnetic field around the coil antenna corresponding to an electrical arc formation at the at least one circuit breaker upon the at least one circuit breaker opening during the load switching operation.

In another implementation, the second spiking signature includes a second increase in the magnetic field around the coil antenna at a determined time after a notch signature time span, wherein the second increase in the magnetic field corresponds to an extinguishment of an electrical arc formed across the at least one circuit breaker upon the circuit breaker opening.

In another implementation, the apparatus further includes an amplifier receiving the current and transmitting the current to the receiver, and the receiver further includes a low pass filter and a Butterworth high pass filter connected to the analog to digital converter.

In another implementation, the at least one coil antenna includes the three orthogonal air-core loop antennas sampling the x, y and z component of the magnetic field.

In another implementation, wherein the receiver includes a sensitivity to a minimum magnetic field of about 10 nT/sqrt (Hz).

In another implementation, the receiver includes a sensitivity to a minimum magnetic field of about 1 fT/sqrt (Hz).

In another implementation, the receiver has an operating frequency within a range of about 1 kHz to about 500 kHz.

In another implementation, the receiver has an operating frequency of about 60 Hz.

In another implementation, the computer and the software are configured to distinguish respective waveform signatures of the magnetic field data for individual circuit breakers according to the relative locations of the at least one coil antenna and the individual circuit breakers.

In one implementation, a system of tracking load switching operations and fault clearing operations of at least one circuit breaker in a power circuit includes at least one coil antenna sensing changes in a magnetic field around the coil antenna. The changes in the magnetic field induce corresponding changes to a current or voltage in the at least one coil antenna. A receiver is connected to the at least one coil antenna and receives the current or voltage. A computer is connected to the receiver and stores a data stream that corresponds to the changes in magnetic field around the at least one coil antenna. The computer uses the data stream to generate a plurality of characteristic magnetic field waveforms for the at least one circuit breaker. The computer assembles a low frequency magnetic signature for a respective circuit breaker from the characteristic magnetic field waveforms generated for the respective circuit breaker.

In another implementation of the system, the computer distinguishes the signature waveform for the respective circuit breaker by the respective locations of the at least one coil antenna and the respective circuit breaker.

In another implementation of the system, the plurality of characteristic magnetic field waveforms includes a spiking waveform, a notch waveform, and a second spiking waveform during a time period corresponding to a load switching operation across the at least one circuit breaker In another implementation of the system, the time period includes a start time initiating the spiking waveform, and the start time corresponds to an increase, from zero, in a sensed magnetic field around the coil antenna, wherein the increase in the magnetic field results from a respective increase in power circuit current across the respective circuit breaker in a closed position.

In another implementation of the system, the spiking waveform terminates when the magnetic field drops from a spiking maximum value to a local minimum value for the spiking waveform.

In another implementation, the time period comprises a contact separation time initiating the notch waveform, wherein the contact separation time corresponds to an increase or a decrease in the magnetic field around the coil antenna from the local minimum value of the spiking waveform to a different value corresponding to an electrical arc formed at the respective circuit breaker upon the respective circuit breaker opening during the load switching operation.

In another implementation, the notch waveform terminates when the change in the magnetic field drops to a local minimum value in magnitude for the notch waveform.

In another implementation, the time period includes an end time initiating the second spiking waveform, wherein the end time corresponds to a change back to zero in the magnetic field around the coil antenna from the local minimum value of the notch waveform, corresponding to extinction of the electrical arc at the respective circuit breaker upon the respective circuit breaker remaining open during the load switching operation.

In another implementation, the second spiking waveform terminates when a sensed magnetic field around the coil antenna increases from zero.

In another implementation, a computer implemented method of tracking load switching operations or fault clearing operations of at least one circuit breaker in a power circuit has steps including positioning at least one coil antenna in proximity to the at least one circuit breaker; sensing changes in a magnetic field around the at least one coil antenna, wherein the changes in the magnetic field correspond to the load switching operations at the at least one circuit breaker and induce corresponding changes to a current or a voltage in the at least one coil antenna; transmitting the current or the voltage from the at least one coil antenna to a receiver; converting the current or the voltage that is input from the at least one coil antenna to a magnetic field data stream tracking the magnetic field in the time domain; and using a computer having a processor and computer memory to store the data stream in the computer memory. The computer generates a plurality of characteristic magnetic field waveforms for the at least one circuit breaker.

In another implementation, the method further includes a step of assembling a low frequency magnetic signature for a respective circuit breaker from the characteristic magnetic field waveforms generated for the respective circuit breaker.

In another implementation, the method includes assembling characteristic magnetic field waveforms for a spiking waveform, a notch waveform, and a second spiking waveform during a time period corresponding to the load switching operation across the respective circuit breaker.

In another implementation, the time period of the method includes a start time initiating the spiking waveform, and the computer triggers the start time upon an increase, from zero, in a sensed magnetic field around the coil antenna, and wherein the increase in the magnetic field results from a respective increase in power circuit current across the respective circuit breaker in a closed position.

In another implementation of the method, the computer terminates the spiking waveform when the magnetic field drops from a spiking maximum value to a local minimum value for the spiking waveform. In another implementation, the time period includes a contact separation time initiating the notch waveform, wherein the computer triggers the contact separation time upon an increase or a decrease in the magnetic field around the coil antenna from the local minimum value of the spiking waveform to a different value corresponding to an electrical arc formed at the respective circuit breaker upon the respective circuit breaker opening during the load switching operation.

In another implementation, the computer terminates the notch waveform when the magnetic field drops to a local minimum value for the notch waveform.

In another implementation, the time period includes an end time initiating the second spiking waveform, wherein the computer triggers the end time upon an increase in the magnetic field around the coil antenna from the local minimum value of the notch waveform back to zero, corresponding to extinction of the electrical arc at the respective circuit breaker upon the respective circuit breaker remaining open during the load switching operation.

In another implementation, the second spiking waveform terminates when the sensed magnetic field around the coil antenna increases from zero.

BRIEF DESCRIPTION OF THE FIGURES

FIG. 17 illustrates the B-field in the x-direction at different contact separation times.

DETAILED DESCRIPTION

The magnetic field emitted by the circuit breaker during load switching and fault clearing (e.g., clearing short circuits or overloads) contains valuable information. Prior research shows that the magnetic field can be used to measure an electrical arc duration [1] and evaluate the arc motion [2]-[5] during a load switching operation that opens a circuit breaker, leading to the arc formation. The information can be used to estimate the contact erosion of circuit breakers. Our previous work captured the magnetic field of a vacuum circuit breaker during load switching, and three magnetic field signatures were observed and studied [6]. These signatures always co-occur with the arc initiation and the arc extinction during the load switching events. Therefore, they could be used to measure the arc duration. Moreover, the signatures can be leveraged to monitor circuit breaker switching operations and further be applied in substation cyber security [6]. It enables the physics-based intrusion detection systems (IDS), which can detect malicious attacks from hackers based on the physical emanations from substation facilities. A magnetic-field-based IDS [7] has been proposed by our team, in which the switching monitoring based on the magnetic signatures can be used. Compared to existing IDSs, the magnetic-field-based IDS could resist more advanced and sophisticated cyberattacks.

One example test procedure described herein proves that the magnetic field emission from circuit breakers in a power circuit can be detected and analyzed according to this disclosure. In one non-limiting embodiment, a model uses a test circuit in addition to a sensing circuit to simulate circuit breaker operation and track at least one magnetic signature waveform generated during load-switching events of the test circuit.

Figure 2:
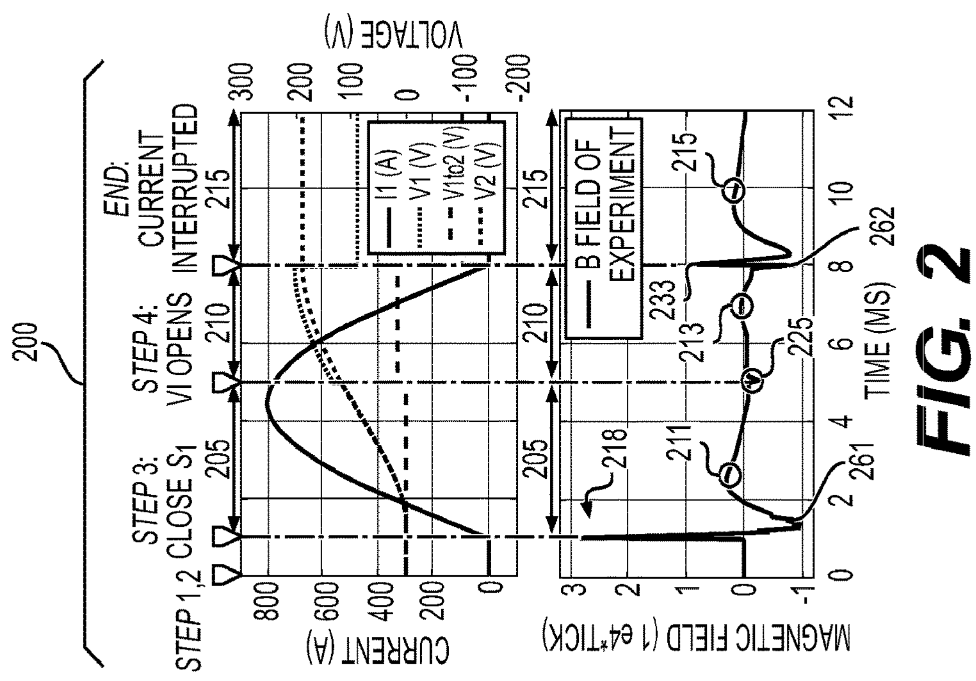
FIG. 2 shows representative plots of measurements of a current interruption experiment according to some implementations of this disclosure.
Figure 1:
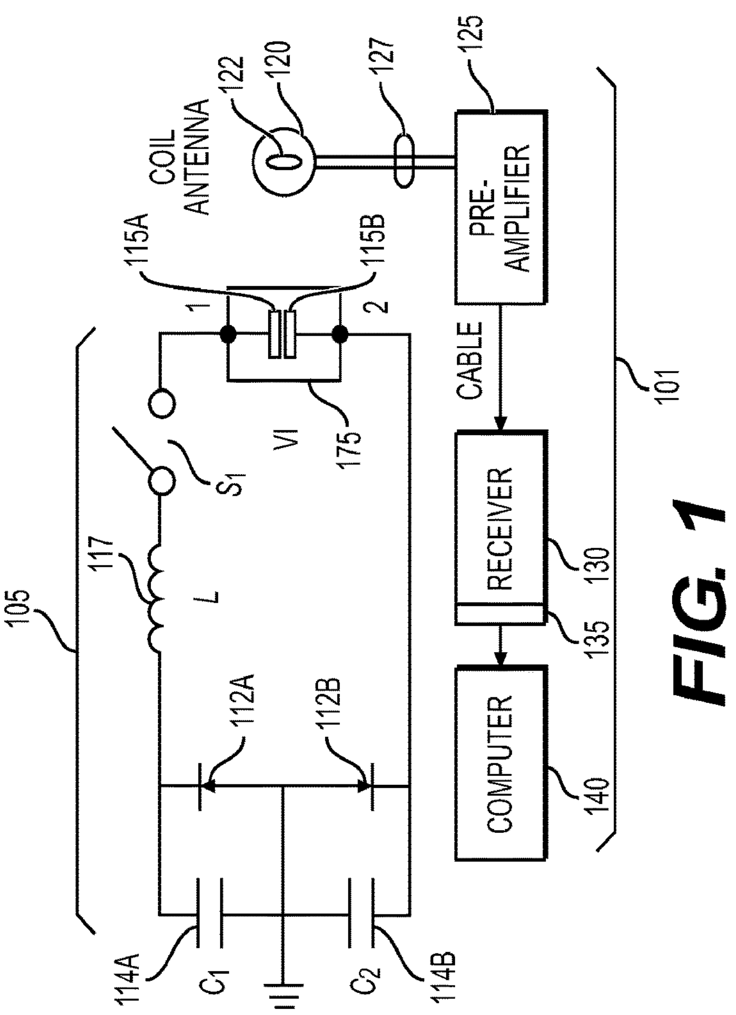
FIG. 1 is a schematic circuit diagram of a synthetic test circuit and magnetic field measurement system according to some implementations of this disclosure.

This disclosure further divides an example load switching operation into steps that relate to a test circuit as shown in FIG. 1. In example embodiments that do not limit this disclosure, an overall test period 200 is divided into five steps to assess magnetic field emissions in the time domain as shown in FIG. 2, and this disclosure includes a number of suitable approaches to simulate the influence of each step on the B-field waveforms for the test circuit 105 of FIG. 1. The time domain may take place over seconds, hours, days, years or months. The five steps can be generalized, for example purposes only, as:

Step 1: open S1 and close VI

Step 2: charge C1

Step 3: close S1 (start of current)

Step 4: open VI (initiation of arc)

Step 5: extinction of arc/current (end).

The physical relationship between the magnetic signature waveforms and the circuit breaker load switching operation is explained based on the results of both experimental results using the sensing circuit 101 and simulation results using models for the steps, both in relation to a test circuit 105. The models are verified by comparing simulated results of a respective characteristic magnetic waveform associated with the steps and magnetic field measurements gathered from the sensing circuit positioned proximately to a real vacuum circuit breaker when it cuts off an alternating current of up to 2.5 kA (peak).

In one example test case, the magnetic signatures currently used for the arc duration measurement and the circuit breaker switching detection are captured from only one vacuum circuit breaker 175. Besides the experiment method using the sensing circuit 101 and the test circuit 105 and, to apply the approach to other circuit breakers with different structures and arc-interrupting techniques, a simulation model 300 is required to assess all five of the above mentioned steps in a load switching operation and/or a fault condition clearing operation (clearing a short circuit or overload). This overall simulation model 300 can help to explain the physical connections between low frequency magnetic signatures described herein and circuit breaker load switching. More importantly, due to the difficulty of circuit breaker experiments, it provides a more feasible way to study the influence of circuit breaker structure and arcing process on the magnetic signatures.

Magnetic field simulation methods can be divided into two categories. One commonly used method to simulate the magnetic field inside the circuit breaker interrupting chamber is the magnetohydrodynamics (MHD) model. The MHD model focuses on the electrically conductive fluid in the presence of the electromagnetic field [8]. It combines Maxwell equations, thermodynamic equations, hydrodynamic equations, and energy equations to calculate the dynamics of conducting fluids. Finite element analysis software is usually used to solve these equations. Using the MHD model, plenty of research on the arc's magnetic field simulation during switching has been done. These studies focus on the impact of the magnetic-field-induced Lorentz forces on the arc appearance and motion inside the interrupting chamber, thereby providing recommendations for circuit breaker contact design [9]-[13].

Another simulation method is the analytical model that is appropriately used to simulate the magnetic field in the substation. The model considers the metal conductors that the current flows through as a combination of several cylinders or lines and then subdivides these cylinders or lines into tiny current segments. By calculating and superimposing the magnetic field of these small current segments, it is possible to evaluate the magnetic field produced by the metal conductor with a complex structure at an arbitrary point in space. Previous work has used the analytical model to evaluate the magnetic field of different power facilities [14]-[22]. The physical laws or models used for the magnetic field calculation vary, including Biot-Savart Law [16], [17], [19], the Hertz dipole [18], [20], magnetic vector potential [14], [15], [21], and finite-difference time-domain (FDTD) method [14], [22].

The analytical model is used to simulate the magnetic field of the circuit breaker during load switching and plot the results over time. The analytical model works well here because in the actual test setup, the coil antenna 120 is at some distance from the circuit breaker (e.g., the vacuum interrupter VI 175). Another advantage of the analytical model is its flexibility to change the current path according to the structure and dimensions of the metal conductors of the circuit breaker. This allows the model to be easily applied to other circuit breakers. This disclosure uses additional modelling tools to assess the magnetic field measurement system of the sensor circuit, which may include but is not limited to, the coil antenna, the low-noise pre-amplifier, and the receiver [23]. This is necessary because the frequency response of the measurement system of the sensor circuit will influence the magnetic field, which is likely responsible for the observed magnetic signatures.

In one non-limiting example, FIG. 1 shows a circuit diagram of an example synthetic test circuit 105 and a sensing circuit 101 proximate the synthetic test circuit 105, used as a magnetic field measurement system to be simulated. The synthetic test circuit may include, by way of example, vacuum interrupter (VI) 175 with axial magnetic field (AMF) design. Numerous brands of vacuum interrupters are available, but in one example, this disclosure utilizes an EATON SL-160 vacuum interpreter to interrupt the alternating current generated by an LC circuit. In the non-limiting example of FIG. 1, two diodes 112A, 112B are connected in parallel with polarized capacitors 114A, 114B to prevent polarity inversion on the capacitors. The procedure for the current interruption experiment includes the above mentioned five steps noted again as:

Step 1: open S1 and close VI 175

Step 2: charge C1 114A

Step 3: close S1 (start of current)

Step 4: open VI 175 (initiation of arc)

Step 5: extinction of arc/current (end).

This disclosure sets forth descriptions of an apparatus, a system, and a method of tracking load switching operations and fault clearing operations of at least one circuit breaker in a power circuit. Each of the separate, but related, embodiments is set forth in more detail in this detailed description. In a general example implemented as shown in FIG. 1, however, three 50 mm-diameter loop antennas, i.e., coil antennas 120, were made by 95 turns of 0.8 mm diameter magnet wires, i.e., wire coils 122, which are used to measure the x, y, and z components of the magnetic field. In this single non-limiting example, the distance between the coil antennas 120 and the vacuum interrupter 175 is 80 cm, and the capacitor bank 114A, 114B and the coil inductor 117 are 2.5 meters from the coil antenna 120. The capacitor bank is in a grounded steel enclosure, and the coil inductor is wrapped in aluminum foil. While this approach reduces the interference in the high frequency range, it does not help to reduce low-frequency and very-low-frequency magnetic fields. The magnetic emission from the capacitor bank and inductor will still be captured during the experiment. For the near field magnetic field, the magnetic field drops off as either $r^2$ or $r^3$ according to different models (dipole or loop). Therefore, the influence of the magnetic emission from the capacitor bank and coil inductor on the final measurement is not apparent. Since the coil antenna 120 used herein is normal to the B-field of the inductor, the impact is further minimized.

The magnetic field signals captured by the coil antennas are first transmitted to a low-noise pre-amplifier 125, then sent to the receiver 130, which in some non-limiting embodiments, can be the Atmospheric Weather Electromagnetic System for Observation Modeling and Education receiver that uses the acronym AWESOME as described in reference [23]. In some non-limiting embodiments, this receiver 130 has a sensitivity as low as 0.03 $fT/\sqrt{Hz}$ (0.3 femto-Tesla per square root Hertz). Receivers of this type are able to detect weak signals of geophysical origins, making suitable instruments to capture the magnetic field produced by a vacuum circuit breaker in the test set-up of this example. It has a flat response between 3 kHz to 400 kHz, but lower frequency components, including 60 Hz, are intentionally suppressed. The receiver 130 is furthermore useful to satisfy the cybersecurity-related needs, which is explained in detail in the previous work [7]. Last, digitalized data, processed by an analog to digital converter (ADC) 135 are finally sent to the computer 140 from the receiver 130.

Typical experimental measurements of the current interruption example are shown in FIG. 2. I1 is observed to be sinusoidal until the end. V1-to-2 is zero at first until the VI 175 opens, and then it becomes the arc voltage (including anode 115A and cathode 115B drops [24]-[26]). V1 is equal to V1-to-2 plus the voltage of C2. C2 is charged after S1 closes, so its voltage increases, and so does V1. The arc quenches at first zero-crossing (end), and I1, V1, V1-to-2 become zero, the voltage of C1, the voltage difference between C1 and C2, respectively. V2 is calculated by subtracting V1-to-2 from V1 instead of measuring.

The magnetic field signal received by the computer is also plotted in FIG. 2. Three characteristic magnetic waveforms 211, 213, 215, also referred to as individual step magnetic signatures, can be observed in the magnetic field during load switching and are listed below. There is a distinct coincidence in time periods 205, 210, 215 between the switching events (steps 3, 4, and 5) and these characteristic magnetic wave forms 211, 213, 215. These characteristic magnetic waveforms 211, 213, 215 within each step or time period 205, 210, 215 are closely related to the electric and magnetic field change caused by these events. Therefore, these characteristic magnetic waveforms 211, 213, 215 can be used as indicators of the circuit breaker load-switching operation [6] or a fault clearing operation at the circuit breaker.

The unit of the B-field in FIG. 2 is the tick of a ±5 V 16-bit analog-to-digital converter (ADC), so each tick represents an input voltage of $10/2^{16}$ V. For the magnetic field between 3 kHz and 400 kHz (flat response), 1 mV represents a B-field of about 32 pT. Therefore, the magnetic field corresponding to the scale of the y axis of FIG. 2 is from −48.8 nT to 146.5 nT. To recover all frequency components, including 60 Hz, this model can be expanded.

Figures 3, 4:
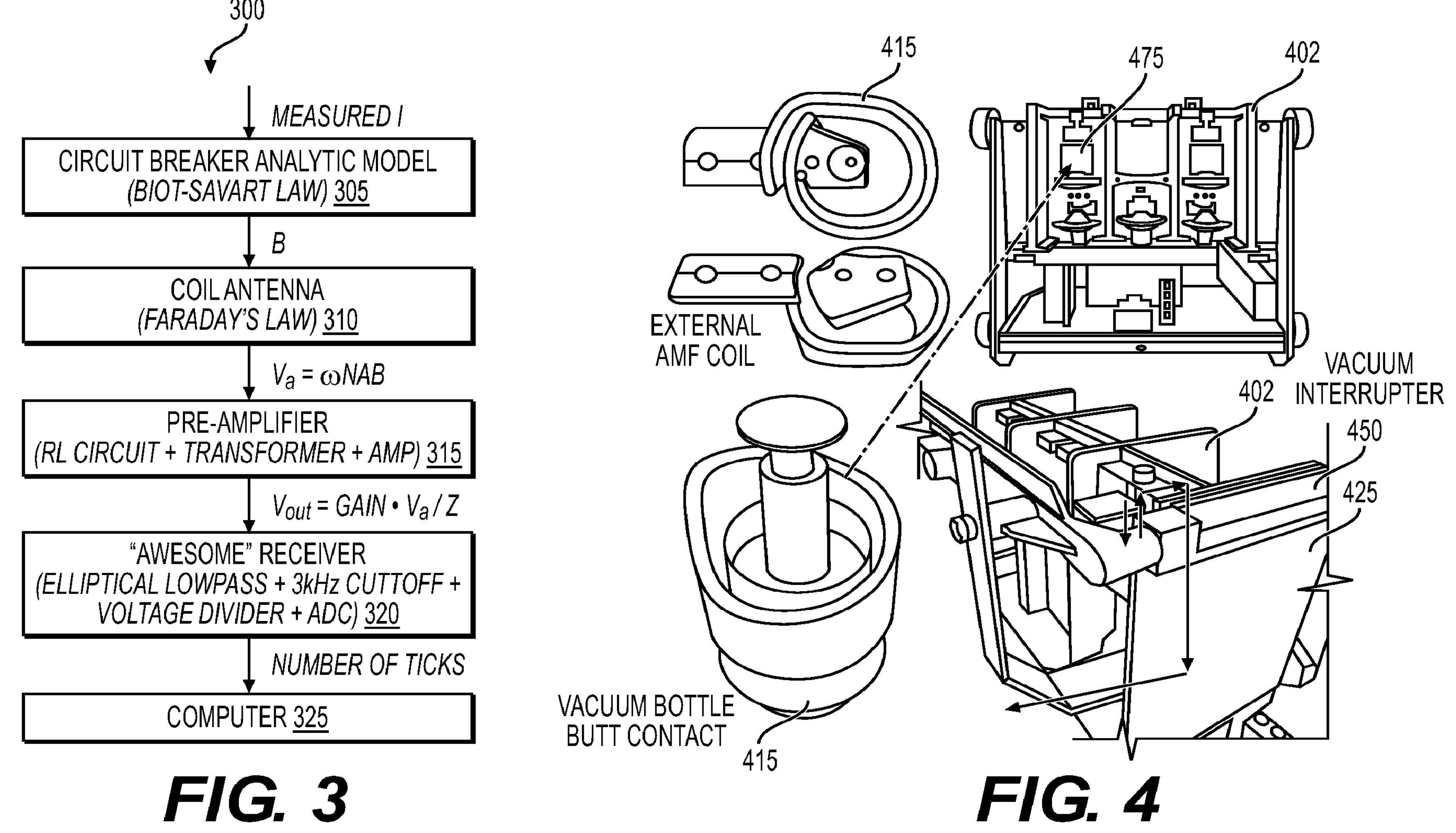
FIG. 3 is a schematic illustration of one example magnetic signature model according to some implementations of this disclosure.
FIG. 4 is an exploded view of a vacuum interrupter, a contact structure, an external AMF coil, and associated current paths according to some implementations of this disclosure.

As noted above, this disclosure utilizes experimental measurements taken within the test circuit 105 (i.e., current I1 and voltages V1, V2, and V1-to-2), as well as additional experimental measurements taken by the sensing circuit 101 to assess the magnetic fields around the coil antennas 120 and the changes in the magnetic fields due to circuit breaker operation. The disclosure includes another aspect, however, in simulating certain individual magnetic signatures that the computer receives, i.e., each processing step in the test circuit 105 that influences the magnetic field signal around the coil antenna 120 must be modeled. Four models have been built to simulate the captured magnetic emission, and they constitute the simulated circuit breaker magnetic signature model 300, as shown in FIG. 3. This process results in the simulated magnetic signatures from the circuit response.

The first model is the Vacuum Interrupter Model 305. The vacuum interrupter (VI) 175, the flat contact 415, and its external AMF coil 415 are shown in FIG. 4. Instead of using the AMF contact, the axial magnetic field is generated by an external AMF coil. The coil is installed on the top of the vacuum bottle 475 and also acts as a terminal for the current flowing into the vacuum bottle 475. The current path 425 through the VI 475 is drawn into the figure, and to make the figure clear, the second current path 450 through the AMF coil 415 is marked. Based on it, the analytical model of VI 475 is established and shown in FIG. 5A. The gray cylinder is the position of the vacuum bottle. The circular path 450 on the top of the vacuum bottle simulates the coil 425 of the VI 475, but the connections between the straight-line conductor and the AMF coil are simplified. The model does not include the capacitor bank, the coil inductor, and the electric cables between these devices. Therefore, the simulated signals should be smaller than the measurements.

Figure 5B:
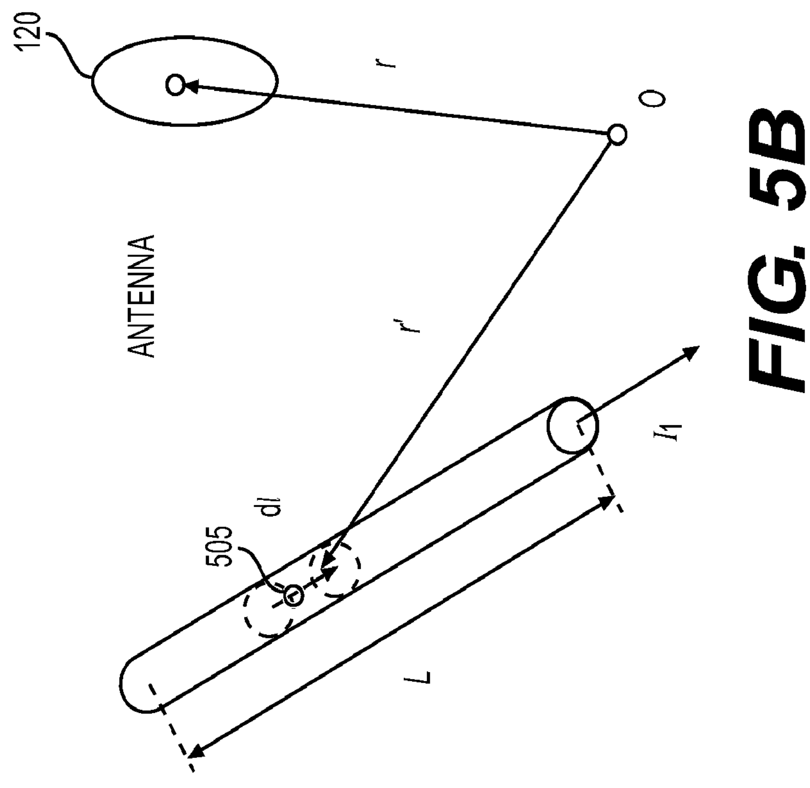
FIG. 5B is a schematic diagram of the B-field at the center of a coil antenna generated by a line current in an example implementation according to some implementations of this disclosure.
Figure 5A:
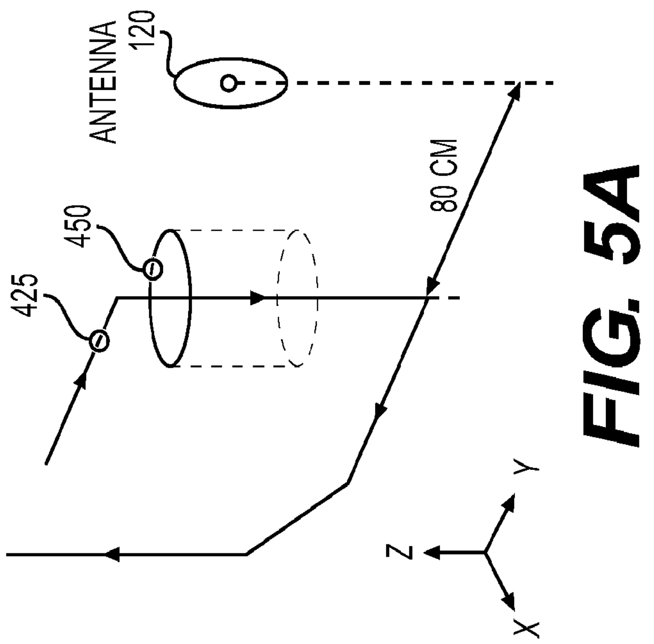
FIG. 5A is a schematic diagram of an example analytical model of a vacuum interrupter and position of a coil antenna according to some implementations of this disclosure.

In this model, the current is assumed to only flow through the solid lines. As shown in FIG. 5B, by evenly subdividing the conductor into n linear current segments 505, Biot-Savart Law is used to calculate the magnetic field at the center of the coil antenna 120. In this disclosure, each line current is divided into $10^4$ current segments. Different numbers of segments (from 1 to $10^4$) are tested, but little change in B-field has been observed as long as the segment number is larger than $10^1$. The measured I1 is the input of the model. Considering the dimensions of the VI, it is assumed that all linear segments have the same current.

This model does not include the arc dynamics due to the contact separation. For the low-current vacuum arc between the butt contacts in an axial magnetic field, the arc is diffused (diffuse cylindrical arc) after the rapture of molten metal bridge and bridge column arc [27]. Therefore, the paper assumes the arc enters the diffuse mode immediately after the contact separation and uses a straight-line conductor to equivalent to the arc. As a result, the structure of the analytical model inside the vacuum bottle (gray cylinder) will not change before and after contact separation. This is only suitable for this type of vacuum bottle.

Next, this disclosure uses a Coil Antenna Model 310. Based on Faraday's law, the induced electromotive force (emf) on the coil antenna 120 (Va)=ωNABx, where ω is the angular frequency of the B-field (or imposed current), N is the number of turns of wire coils 122, A is the area of the loop, and Bx is the amplitude of the magnetic flux normal to the antenna surface [23]. It should be clarified that the above equation is for a single frequency B-field ($B_x e^{-j\omega t}$). So, the Fourier and inverse Fourier transform is used to calculate the emf contributed by all frequency components. The procedure is shown in (2) to (4), where the B and Va are phasors.

$$B(t) \xrightarrow{\mathcal{F}} B(n) = \{B_{at\ nHz} \mid n = \xi_1, \xi_2, \xi_3, \ldots \xi_m,\} \tag{2}$$

$$V_{a\ at\ nHz} = j\omega NAB_{at\ nHz} \tag{3}$$

$$\{V_{a\ at\ nHz} \mid n = \xi_1, \xi_2, \xi_3, \ldots \xi_m\} = V_a(n) \xrightarrow{f} V_a(t) \tag{4}$$

Figure 6:
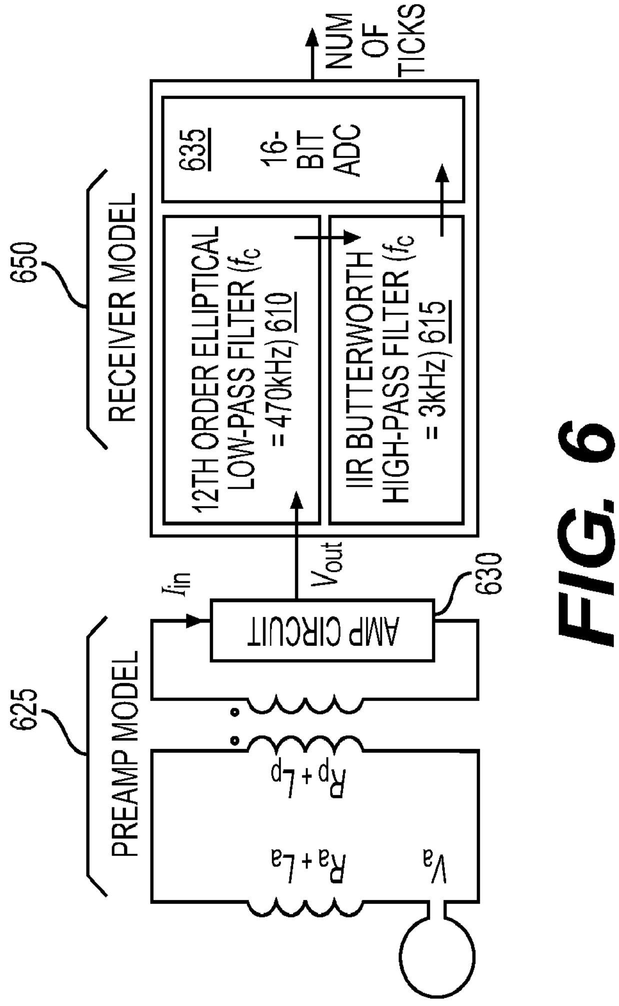
FIG. 6 is a schematic illustration of a model of a preamplifier and receiver according to some implementations of this disclosure.

The Preamp Model 315 follows. The low-noise preamplifier 125 amplifies the tiny antenna signal Va. However, the signal has changed before the amplification due to the antenna impedance and the input circuit. The goal of the input circuit 127 is to yield a net current with a flat frequency response in the desired frequency range [23]. As shown in (5), ω on the denominator cancels out ω on the numerator when ω is fairly large. To simulate the impact of the preamp, a simplified input circuit 625 is used in the model, shown in FIG. 6, and (5) is also derived based on this input circuit 625. The preamp model 315 uses an ideal amplifier 630 to simulate multiple differential amplifiers in the real world.

This ideal amplifier has a frequency-independent gain, and its output is transmitted to the receiver model.

$$I_{in}(n) = \frac{\omega * NAB_x(n)}{R_a + R_p + i * \omega * (L_a + L_p)} * \text{Ratio} \quad (5)$$

The Receiver Model 320 follows the Preamp Model 315. In the sensing circuit 105 of FIG. 1, the receiver 130 synchronizes the data from the preamp with the GPS time, filters the data, converts the analog signal to a 16-bit digital signal with an ADC 135, and then sends it to the computer 140 of FIG. 1. Its major change to the magnetic field signal is caused by the anti-aliasing filter (an upper cutoff of 470 kHz) and its low cutoff below 3 kHz [23]. Therefore, the receiver model 320, 650 is simulated by two filters 610, 615 and a 16-bit analog-to-digital converter (ADC) 135, 635. An 8th-order or $12^{th}$ order elliptical low-pass filter 610 (fc=470 kHz) and an IIR Butterworth high-pass filter 615 (fc=3 kHz) are used to simulate the filtering process of the receiver 130. An ADC 135, 635 with a ±5 V range is used to digitalize the data in the receiver model.

Figure 7:
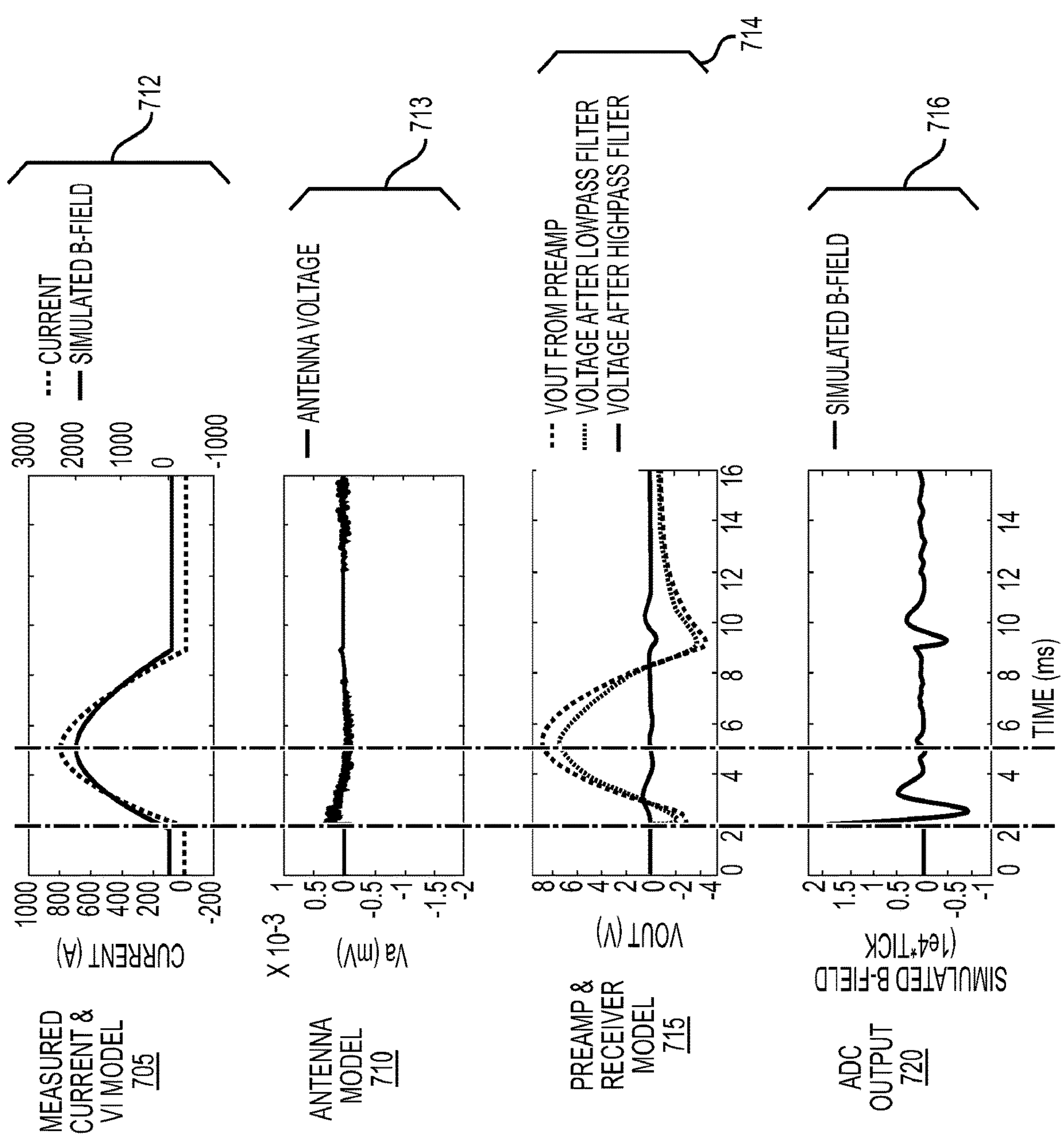
FIG. 7 is a series of simulated magnetic fields according to some implementations of this disclosure.

The simulated magnetic field signal calculated from each simulation step from FIG. 3 is shown in FIG. 7. From top to bottom, they are 705) the current measured in the current interruption experiment and the simulated magnetic field, 710) the antenna output voltage, 715) the net current inputted to the amplifier, 720) the voltages in the receiver, and the tick output of ADC as shown in FIG. 2. The sine current starts from 2 ms in the figure and is interrupted at around 9 ms, and the magnetic field calculated by Biot-Savart Law exhibits a similar waveform.

Such a sinusoidal characteristic does not appear again in the antenna voltage. It is because each frequency component of the B-field is multiplying with its corresponding ω, as shown in (3), causing that even initially weaker frequency components of the B-field can still induce a strong emf component, especially for high frequencies. Therefore, the original sinusoidal feature is submerged in other frequency components. This is also why the noise is stronger in Va—the noise is amplified by multiplying with ω. Moreover, the change in phase angle has occurred in this step, further obscuring the original feature.

Subsequently, the current generated by Va is coupled to the secondary side and then serves as the input of the amplification circuit [23]. Since a frequency independent gain is used in the preamp model, Vout is identical to Iin except in the amplitude. It can be observed from the third figure of FIG. 7 that Vout has exhibited a waveform similar to the original B-field. This is due to the fact that the flat response design somewhat offsets the effect of ω, as shown in (5). However, resistance values still dominate the denominator when ω is low. Therefore, the net current waveform is still different from the B-field.

Vout is then filtered by the 8th order elliptical low-pass filter (fc=470 kHz) and the IIR Butterworth high-pass filter (fc=3 kHz) in the receiver model, yielding the other two waveforms shown in the third figure of FIG. 7. The results show that there is no significant change in the waveform after the low pass filter because the frequency components above 470 kHz are weak in Vout. But the waveform strongly deforms after the high-pass filter, and the individual magnetic signatures can be observed. Finally, the signal is digitalized, as shown in the last figure of FIG. 7.

If the B-field is calculated accurately, some signatures can be explained based on the waveform changes shown in FIG. 7. In general, each step in the measurement system has its irreplaceable role in converting the B-field signal from a quasi-single-frequency sine waveform to the combination of the magnetic signatures. In plots 705 and 710, abrupt changes in the B-field/current waveform at 2 ms (current onset) and 9 ms (current interruption) should be the origins. These changes have introduced a wide range of frequency components to which each part of the measurement system responds differently, resulting in respective low frequency magnetic signatures 712 and 714. Based on the observation, the high-pass filter in the receiver may contribute the most. But the origin of signature 713 is hard to determine because no noticeable change is observed in the B-field at contact separation time (the second dash line in FIG. 7), and the model fails to simulate it. It will be discussed later in this paper.

Simulation of B-field during Load Switching. To validate the model, the simulated magnetic field signal is compared with the measured magnetic field signal. Five sets of simulated signals (a)-(e) and measured signals are plotted in FIG. 8. The "VI 175 opening" time (the contact separation time, $t_{cs}$) of these current-interruption experiments varies from 4.0 to 7.7 milliseconds. The time the notch waveform 213 appears, marked with a triangle at the notch 807A, 807B, 807C, 807D, 807E, is the $t_{cs}$ of each experiment. The noise of the simulated B-field is higher than the measured one. These noises come from the current (the input of the model) measured by the Rogowski coil during the current interruption experiments.

Figure 8:
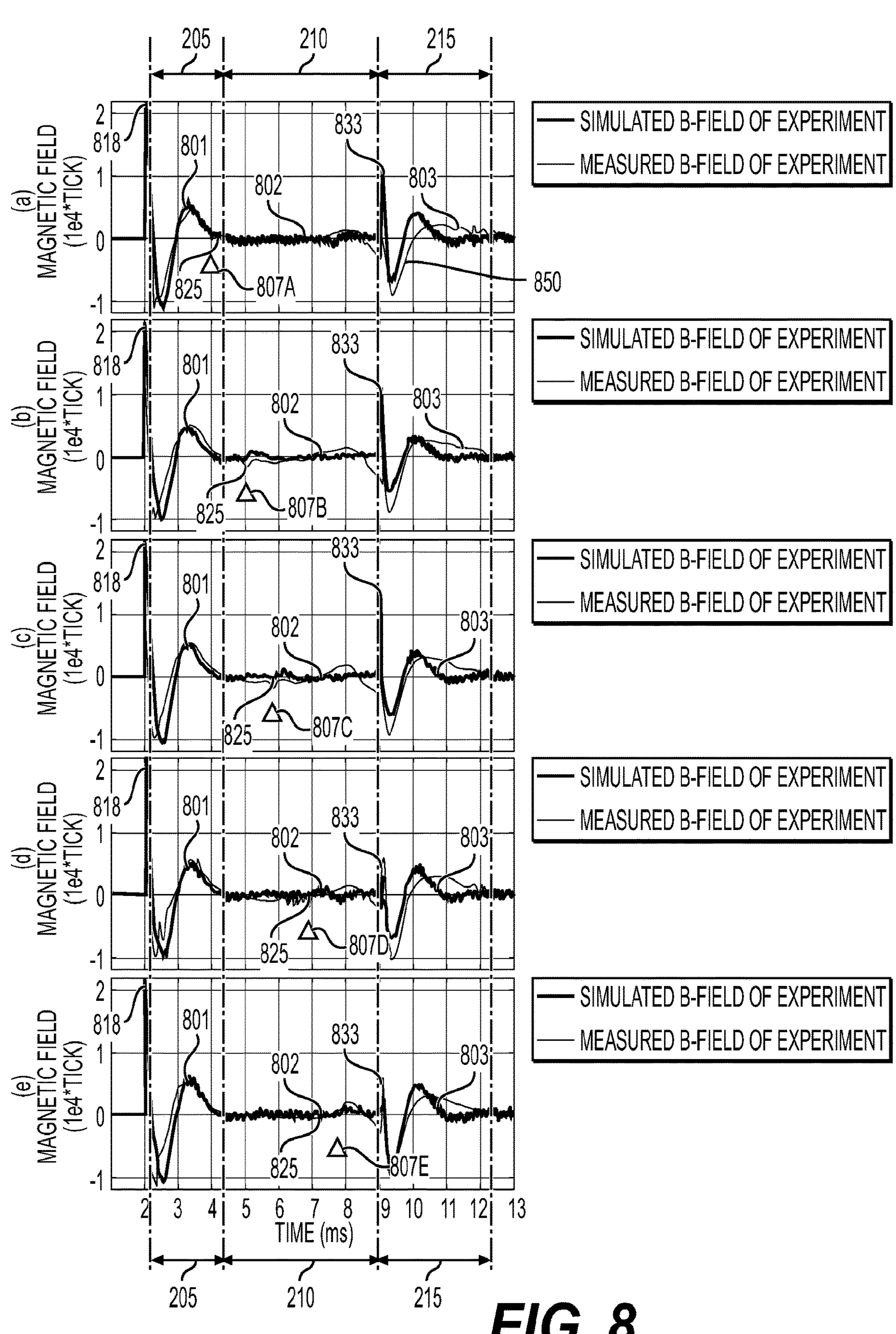
FIG. 8 is a series of simulated magnetic fields and measured magnetic fields according to some implementations of this disclosure.

It can be observed in FIG. 8 that the simulated magnetic field signal is consistent with the magnetic field signal received by the computer, which suggests that the design and simplification of the model are reasonable. However, there are still some differences between the two in detail. First, the two waveforms are different between 7 ms and 9 ms. Second, the simulation results of each individual magnetic signature vary. The shape of signature-1 801 has been well simulated, but the peak value of spiking is smaller than the measured signal. It is possibly caused by the missing B-field contributions from the capacitor bank and coil inductor. Also, the negative peak of signature-2 802 the simulated data is later than the peak of the measured data. The notch waveform is not clear in all simulated data, but the bump after the notch waveform is well modeled, which is more evident in plots (b) and (c) of FIG. 8. The shape of signature-3 803 in the simulated data is similar to the measured data, but its spiking has disappeared, and its following oscillation wave tail is different.

It is notable that the characteristic magnetic waveforms 211, 213, 215 and 801, 802, 803 are indicative of the first spiking 218, 818, the notching 225, 825 during arc formation, and the second spiking 233, 833 whether the changes in the waveforms increase or decrease. Specifically, the respective directions of the characteristic magnetic waveforms are related to the direction of the coil antenna placement and the direction of the current (positive or negative). In principle, for example, the identified notch in a notch waveform can be either positive (increase) or negative (decrease). In some examples of this disclosure, the measurements show the results are that spiking is all positive and the notch is all negative but these examples are not limiting of the disclosure.

Aside from the noise interference, measurement errors, and instrument failures, the following reasons may cause the above differences.

Use of Biot-Savart Law: Using Biot-Savart Law with an analytic VI model provides ease of the magnetic field calculation, but two limitations may affect the accuracy of the simulation. First, Biot-Savart Law applies to the magnetostatic conditions, i.e., the current does not, vary with time. For substations or transmission lines dominated by 60 Hz [16], [17], [19], the errors in the magnetic field calculation might not be significant. However, the magnetic signatures of interest in the paper are between 3 kHz and 400 kHz. Although these signatures are not only caused by the current components from this frequency range due to the presence of the preamp and the receiver, the effect of the changing current is no longer negligible.

Second, in the analytical model of VI, only the conduction current (11) is used to calculate the magnetic field. However, displacement current can also generate the magnetic field, according to Ampère's circuital law. The displacement current is induced by the electric field change ($\partial D/\partial t$). In the load-switching experiments this paper concerns, the electric field changes mainly come from two aspects. First, the electric potential of the VI is changing due to the shift in V1 and V2. As shown in FIG. 2, before S1 is closed, both V1 and V2 are zero, so the VI is also at zero potential. Then S1 closes, and V1 and V2 start to increase until the arc extinction. This leads to the increase of the electric potential of VI. The varying potential will cause the electric field to change and thus generate the magnetic field.

Second, the voltage difference between contacts (V1-to-2) has abrupt changes that would impact the electric field. As observed in FIG. 2, V1-to-2 starts as zero until it changes abruptly at Step 4 and the End. In Step 4, a high electric field is instantaneously established between the contacts as they start separating. Then the E-field decreases as the gap between contacts increases since V1to2 remains the same. In the End, V1 suddenly becomes the voltage of C1, so V1to2 becomes from the arc voltage to the voltage difference between C1 and C2 (which is much higher than arc voltage). It causes the E-field between contacts to reverse and increase abruptly. These E-field changes would also induce the magnetic field.

Straight-line arc path: Although the arc in the circuit breaker with an external AMF coil is a diffuse arc, the current density of the arc column may still be uneven at the beginning phase of the arc. Based on previous studies on the arc in VI, a molten metal bridge will first form at the last contact spot. Its duration is a few hundred microseconds, and then it will rupture and transform into a bridge column arc [27]. The molten metal bridge and bridge arc are not necessarily formed at the center of contacts, and they will merge first if two or more bridges appear. In addition, it is also possible the diffusion arc is not sufficiently diffused due to reasons like contact wear so that the central axis of the arc does not always coincide with the central axis of contacts. Therefore, using a straight-line current path to simulate the arc path is not accurate enough.

Frequency-independent amplifier: An ideal amplifier is used in the preamp model. However, in practice, the gain of the differential amplifiers on the secondary side is still frequency-dependent. The preamplifier should have higher or lower gain for frequencies lower than 3 kHz and higher than 470 kHz, resulting in different simulated waveforms.

Butterworth high-pass filter: A Butterworth filter is used to simulate the low cutoff effect of the receiver. However, the frequency response curve of the Butterworth filter used in this model may differ from the receiver's actual lower cutoff frequency response curve. Based on the discussion in section A in this chapter, the high-pass filter contributes the most to the transformation from a quasi-single-frequency sine waveform to magnetic signatures. Therefore, this difference may result in over or under-suppression of specific frequency components of the simulated signal and thus lead to the inaccuracy of the model. One goal of these filters is to filter out the frequency components which are not in the example low frequency range.

Optimization Procedures

To address the above issues of the model, the paper proposes several optimization approaches to improve the precision and capability of the model.

Using different physical laws: different physical laws should be used to calculate B-field, and the E-field should be included in the model to estimate the displacement current caused by E-field changes. The E-field can be derived according to Coulomb's law, Gauss's law, etc. The displacement current should be used together with the conduction current to calculate the magnetic field.

Optimizing arc zone: The arc path should not be equivalent to a single straight line during the whole arcing process. The distribution and dynamics of the arc during switching should be considered. The vacuum arc behavior between butt, AMF, and transverse magnetic field (TMF) contacts are well investigated in previous studies [27]-[35]. Based on the described arc motion and appearance, the following approaches should be taken: 1) the arc path should not be distributed only on the center axis of contacts; 2) the movement and appearance changes of the arc should be considered in the VI model; 3) the arcing zone should increase gradually as the contact separates.

Calibrating components: Considering the complexity of the electric circuit, the model should still use simplified circuits and ideal units, but the response of these circuits and units needs to be calibrated experimentally. The frequency response of the differential amplifiers on the secondary side and the receiver's low cutoff should be measured. The data should be used to optimize the ideal amplifier and Butterworth filter.

This disclosure investigated the magnetic signature of an AMF vacuum interrupter during load switching. Three characteristic magnetic-field waveforms (CMWs) are extracted and analyzed. Experiments confirm that these CMWs are caused by the abrupt change of contact voltage, and their happens are synchronized with switching operations of the vacuum interrupter and the arc extinction. Due to this connection, a CMWs-based non-invasive approach is established to detect the vacuum circuit breaker operation and estimate the arc duration.

The investigation of a circuit breaker's magnetic field emission provides fundamental data to estimate contact wear caused by the arc and perform magnetic field-based online monitoring of the switching operation of the circuit breaker. In another example implementation, a synthetic test circuit 900 was designed as described above and built to measure the magnetic field emission when the vacuum circuit breaker 975 interrupts an alternating current. The test circuit 900 allows for adjusting the current amplitude, the contact separation time (arc initiating time), and the locations of magnetic field sensors. Fundamental characterization 1000 of the magnetic field emission before and after arc quenching and its correlation with arc current and voltage and circuit breaker operations are presented. Three characteristic magnetic-field waveforms (CMWs) 211, 213, 215 appear in the magnetic field 1005, and their causes are studied. Experiments confirm that these CMWs are strongly related to the abrupt change of the contact voltage, and their occurrences are synchronized with the opening and closing events of the vacuum interrupter and the arc extinction respectively.

Based on this, a CMWs-based non-invasive method to detect contact erosion and circuit breaker operations is proposed.

Circuit breakers are one of the most critical elements of substations because they are responsible for controlling and protecting the power grid. The safe and stable operation of a grid level power system is coupled to the control of circuit breakers in substations. However, in recent years, this reliable control has been threatened by various sources. Circuit breakers see more switching operations, thus wear, due to the increasing integration of distributed generation. When switching occurs a considerable amount of thermal and electric energy is released which can erode the contacts. Contact erosion will lead to increasing contact resistance and decreasing lifetime of the device [36]. To reduce the impact of contact erosion and minimize the maintenance cost, the time-based maintenance (TBM) is applied at the beginning and then shifted to the condition-based maintenance (CBM) and the reliability-centered maintenance (RCM) [37].

The CBM and RCM require the technique of contact erosion modeling. Commonly used parameters to indicate the contact performance include but are not limited to 1) travel distance between contacts, 2) dynamic contact resistance, 3) arc duration/arc energy, etc. The detection based on the travel distance is limited by its low accuracy due to the mechanical vibrations during circuit breaker operations and is not suitable for online measurement [38,39]. The ambiguous relation between the arc quenching capability of contact and dynamic contact resistance requires further validations [40]. Therefore, the approach based on the arc duration (arc energy) is a promising strategy to estimate contact erosion degree. Due to the high-energy nature of electric arcing, various physical emissions can be observed during the arc burning process. Physical emissions include optical, acoustic, thermal, and electromagnetic field signals. Each property has been studied to determine the arc duration [41-46]. Although all detection methods are theoretically feasible, the optical and thermal measurements in an active circuit breaker is inconvenient due to the need to probe interrupting chamber. Therefore, the promising candidates for arc duration detection are acoustic and electromagnetic field signals.

Another threat that emerged in recent years to circuit breaker reliability are cyberattacks. In 2015, the world's first successful cyberattack on substations occurred in Ukraine. In this attack, all circuit breakers across 30 substations were shut down, affecting power distribution to more than 200, 000 people. More importantly, since the supervisory control and data acquisition (SCADA) system is compromised, the intrusion detection system (IDS) which uses SCADA measurements as input didn't detect any malicious controls of circuit breakers. Because of this, IDSs based on the physical emanations rather than SCADA data could be useful to prevent future attacks [47,48]. An air-gapped distributed intrusion detection system which uses the magnetic field signals to detect abnormal operations in substations, like unexpected switching operations of circuit breakers, is proposed by our team. To realize the system, the knowledge of the magnetic field signature of circuit breakers during the switching operations is necessary.

This disclosure aims to investigate the magnetic field signature of a vacuum circuit breaker during load switching and explore the possibility of using the magnetic field to estimate contact erosion and detect circuit breaker operations. One section below introduces the synthetic test circuit designed to measure the magnetic field signature during the current interruption by a vacuum circuit breaker. Another section below demonstrates the experiment results in detail and proposes an approach to achieve the proposed project goal.

Figure 9:
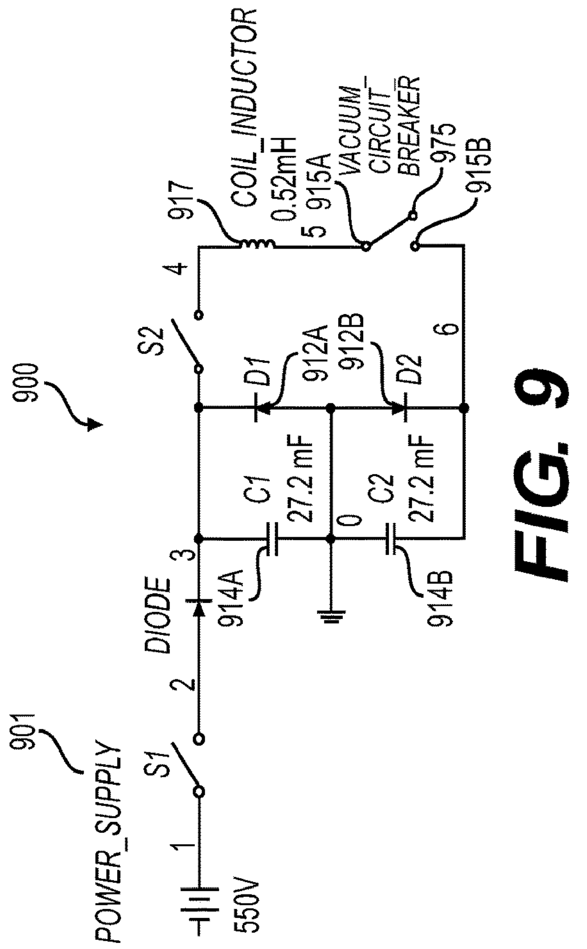
FIG. 9 is a schematic circuit diagram of an example synthetic test circuit according to some embodiments of this disclosure.

The circuit diagram of the synthetic test circuit is shown in FIG. 9. The test circuit 900 includes a power supply 901, capacitor bank 914A, 914B, coil inductor 917, and an EATON SL-160 vacuum interrupter (VI) 975 with axial magnetic field contacts 915A, 915B. It is an LC circuit if S1 is open while the output switch (S2) and the VI are closed. Since electrolytic capacitors are used in this circuit, the upper and lower part of the capacitor bank needs to be connected in reverse series. Two diodes 912A, 912B are parallel with these capacitors to prevent voltage inverse. The LabVIEW program controls the VI 975 and the output switch of the capacitor bank (S2) to perform experiments. The experimental procedures are as follows. The current flowing through the VI 974, the arc voltage (voltage difference between two contacts 915A, 915B), the contact voltage to the ground, and the magnetic field are recorded during the experiments implementing the following steps:

1) open S2, close S1, and charge the upper capacitor bank.
2) open S1 to isolate the power supply from the circuit.
3) close the VI and prepare for the current interrupting.
4) close S2 to start the current.
5) open VI to cut off the current.

To measure the arc magnetic field, a low frequency receiver such as receiver 130 of FIG. 1 is used, and the receiver may be a receiver as described in reference that utilizes the AWESOME design discussed in the reference. The receiver has a sensitivity as low as 0.03 $fT/\sqrt{Hz}$. It is designed to detect weak impulsive signals of geophysical origins, making it a suitable instrument to analyze. It is designed to detect weak impulsive signals of geophysical origins, making it a suitable instrument to analyze the lightning-like signal produced by a vacuum circuit breaker. For arc magnetic field detection, three loop coil antennas 120 are designed to have 50 mm diameter air cores, using 95 turns of 0.8 mm diameter magnet wire as wire coils similar to wire coils 122 of FIG. 1. Each loop has a resistance of 1Ω and 1 mH of inductance to match the amplifiers. They respectively capture the magnetic field in its x, y, and z components.

Figure 10:
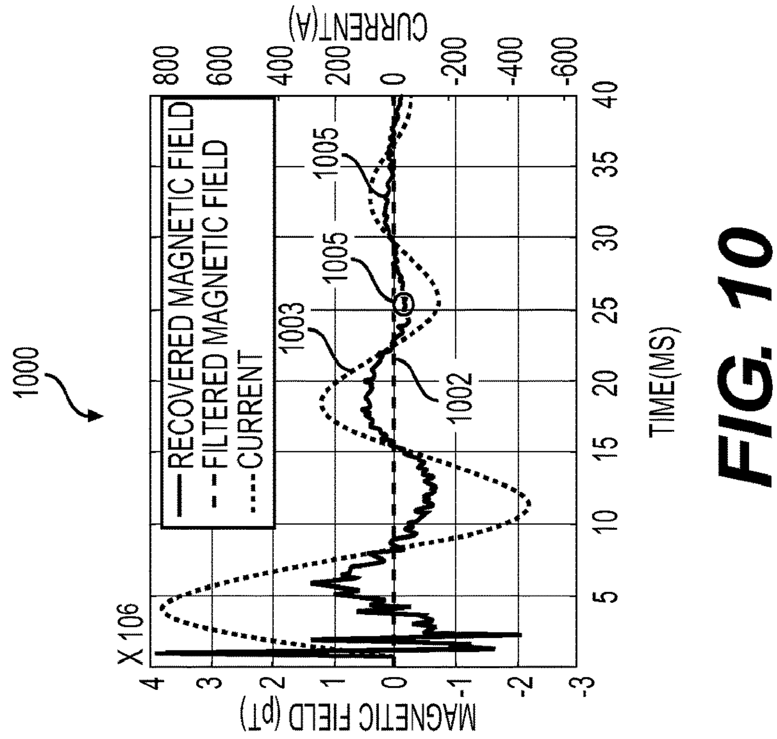
FIG. 10 is a plot of a recovered magnetic field and a filtered magnetic field according to some embodiments of this disclosure.

Since the "AWESOME" receiver of reference receiver was originally designed to cover the low-frequency range of 0.5 to 500 kHz, it specifically filters out the 60 Hz power line signals, which are typically considered noise. Based on its frequency response, frequency components under 500 Hz can be recovered (FIG. 10). However, this disclosure will still discuss the filtered magnetic field 1002 because the 60 Hz component is too prominent and will mask most of the magnetic field information at other frequencies. To ensure the accuracy of the measurement, the background magnetic field in the laboratory and the magnetic field of the control circuit (large capacitors, inductors, and switches) are measured repeatedly. Both are negligible. All magnetic field measurements in this paper are repeatable. FIG. 10, therefore, plots a recovered magnetic field 1005 from a sensor circuit 105 (FIG. 1) and a current value 1003 across wire coils.

Figures 11, 12:
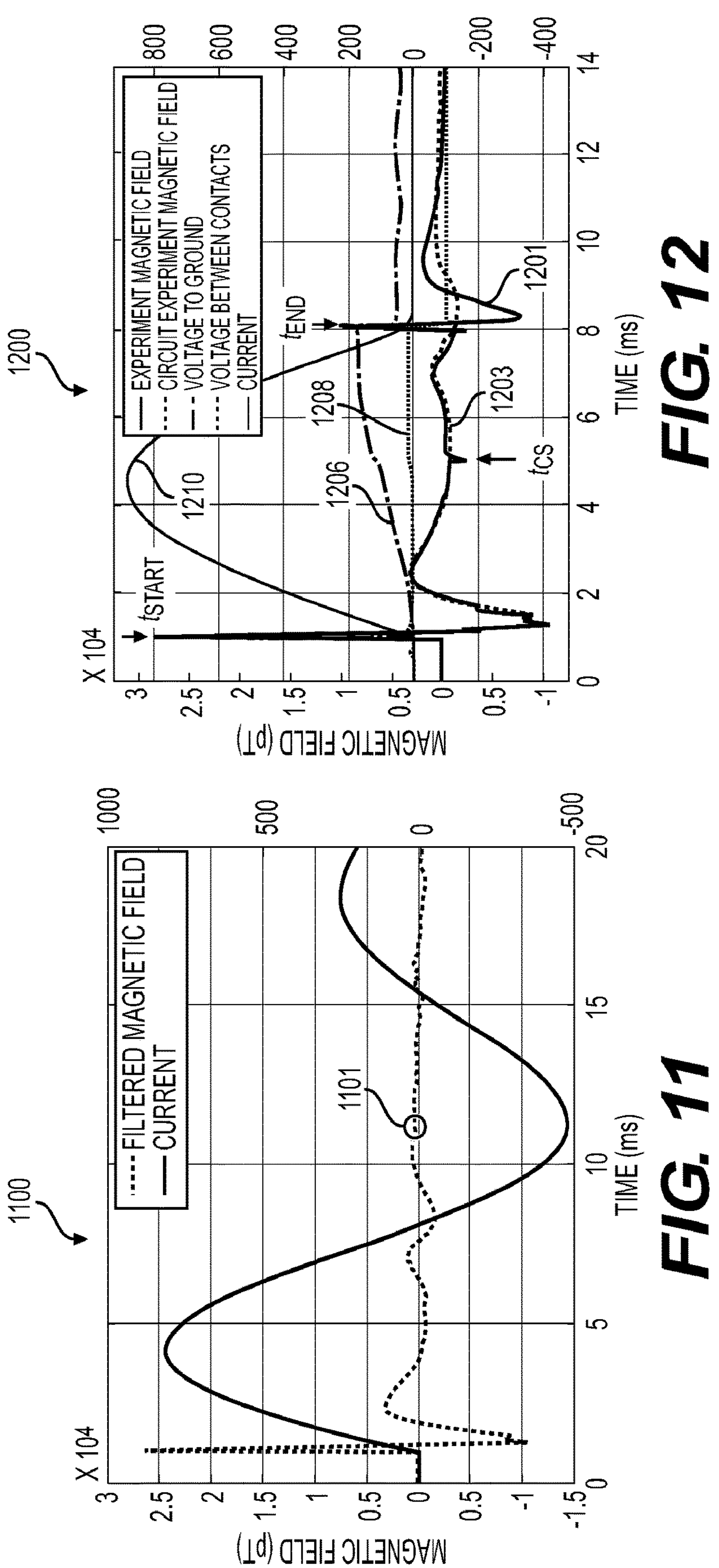
FIG. 11 is a plot of a circuit magnetic field and current flowing through an example vacuum interrupter according to some embodiments of this disclosure.
FIG. 12 is a plot of identified current and voltage measurements for an example experimental circuit as well as magnetic field values for an overall experiment circuit under example conditions as illustrated according to certain implementations of this disclosure.

FIG. 11 shows the magnetic field signal 1101 when the VI does not open, i.e., all steps are executed except step 5. Since this disclosure focuses on the magnetic field of the circuit breaker during load switching, it is necessary first to record the magnetic field of the test circuit with no current interruption at 1100. Then, the change in the magnetic field due to the arc could be studied. For convenience, the waveform will hereinafter be referred to as "the circuit magnetic field", and the magnetic field during the load switching is "the experiment magnetic field".

General Characteristics of Vacuum Circuit Breaker Magnetic Field during Load Switching. FIG. 12 plots the current 1200 of a power circuit, the voltage 1208 between two contacts, the contact voltage 1206 to ground, the experiment magnetic field 1201, and the circuit magnetic field 1203. As shown, the experiment magnetic field is the solid line, and the circuit magnetic field is the dash line. The current and voltages are the dot, dash, and solid lines. Some "times" are also marked in the figure based on the current and voltage waveform to facilitate the discussion of the magnetic field. The following is brief description of certain points in time that prove useful in this discussion:

$t_{start}$: this is the current starting time. In FIG. 9, the output switches S1, S2 close at this time, and the current begins to flow through the VI 975. Before $t_{start}$, the circuit is open, and the current is zero. The contact voltage to ground has a sudden change at $t_{start}$, because the contact is connected to the charged capacitor 914A when the LC circuit is formed, and thus see the charging voltage of the capacitor.

$t_{cs}$: this is when the contacts of the VI 975 open, i.e., "contact separation time". The arc initiates at this moment. Determination of this time depends on the voltage between two contacts 915A, 915B (voltage with smaller amplitude). It can be observed that voltage remains zero at the beginning and then shifts to a specific voltage at about 5 ms. This voltage shift represents contact separation since the voltage should remain zero if the contacts are firmly closed. The voltage shift is 12 V, which is the arc voltage. In experiments using this VI, the arc voltage remains the same. The same voltage change also occurs in the voltage to ground. This is because the sudden onset of the arc voltage causes the ground potential of the contact to be raised.

$t_{end}$: the current returns to zero at this time and no longer changes. When the current decreases to zero, the arc is extinguished. Therefore, no current flows through the VI 975 because of the open circuit. In experiments of this disclosure, since contacts 915A, 915B separate in the first half cycle and no re-ignition of arc occurs, this time is always the first zero-crossing point of the current waveform. It is observed that a voltage change occurs at $t_{end}$. Since the circuit is open after extinguishing the arc, the voltage between contacts becomes the voltage difference between two parts of the capacitor bank instead of the arc voltage. Transient recovery voltage can be observed in some tests during this voltage change.

Based on these times of incidence, the experiment magnetic field can be divided into four stages for discussion: 1) before the current, 2) current initiation time, 3) arcing time/arc duration, 4) after the arc. First, before $t_{start}$, no current flows through the electric circuit, and no significant electric field changes happen, so the magnetic field remains zero. The second stage is from $t_{start}$ to $t_{cs}$, and the current starts to flow through the VI during this period. A spiking characteristic magnetic waveform 211 can be observed at the $t_{start}$. In this stage, the circuit magnetic field and the experimental magnetic field are coincidental because their current distributions (path, direction, and density) in space are same before the contact separation. The third stage starts with the contact separation which causes the arc initiation at $t_{cs}$. Due to the contact separation and existence of arc, the current distribution in space may change. Moreover, since the contacts of vi have a voltage difference (arc voltage) now, the separating movement of the two contacts will change the electric field, i.e., the derivative of electric displacement vector D is nonzero. Therefore, from $t_{cs}$, the experiment magnetic field becomes different from the circuit magnetic field. It is noticeable that a notch characteristic magnetic waveform 213 occurs exactly at $t_{cs}$, and it could be caused by the change of both current distribution and electric field during the contact separation. The last stage is after $t_{end}$. Again, a second spiking characteristic magnetic waveform 215 can be seen at the beginning of this period, and its shape is very similar to the one at $t_{start}$. Since the arc has been extinguished and current no longer exists in the electric circuit, this spiking in the magnetic field can only be induced by the change of the electric field. The fast voltage change at $t_{end}$ may support this hypothesis.

Extraction and Analysis of Characteristic Magnetic-field Waveforms. To investigate the magnetic signature of VI 975 during load switching with more detail, three characteristic magnetic-field waveforms (CMWs) that appear in the experiment magnetic field at the three "times" 205, 210, 215 mentioned above are extracted: 1) CMW1: Spiking waveform at $t_{start}$, 2) CMW2: Notch waveform at $t_{cs}$, 3) CMW3: Second Spiking waveform at $t_{end}$. Their physical meanings are studied then. The three CMWs collective form a low frequency magnetic signature for a circuit breaker under consideration.

Figure 13:
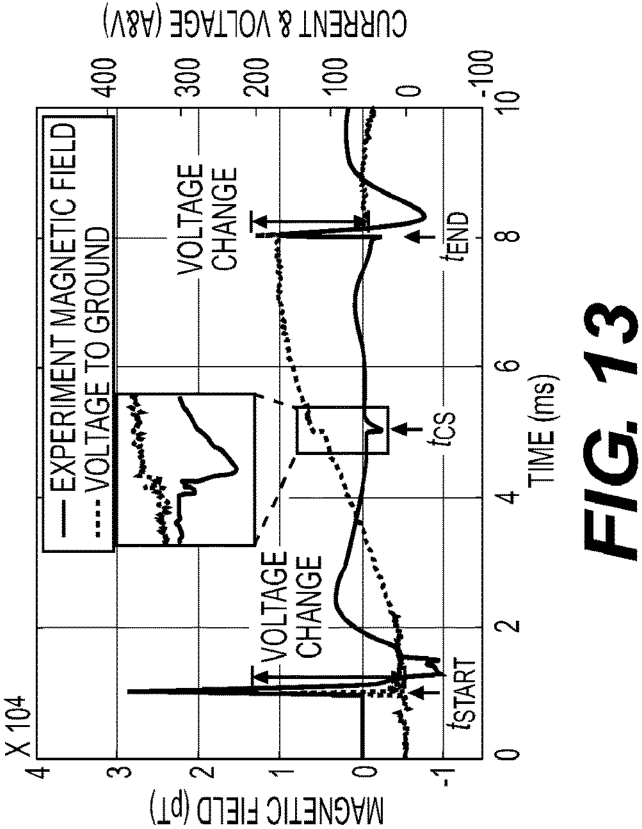
FIG. 13 is a plot of characteristic magnetic waveforms and example contact voltage measurements according to certain implementations of this disclosure.

FIG. 13 reveals the time relationship between the CMWs and the change of the contact voltage. In FIG. 13, abrupt changes in the contact voltage could be observed both at $t_{start}$ and $t_{end}$, and the CMW1 and CMW3 appear correspondingly when the voltage change happens. As analyzed in the last section, because of the absence of current, CMW3 is caused by the electric potential change. Since the current just starts at $t_{start}$, CMW1, with a similar shape to CMW3, could also be contributed by the derivative of D due to the sudden voltage change (VC). Further, since the VC is greater at $t_{start}$, the peak of CMW1 is much higher than CMW3. Moreover, it is noticed that CMW2 co-occurs with the contact voltage shift at $t_{cs}$. A weaker notch waveform and a smaller VC before $t_{cs}$ have also been recorded. This is caused by an unexpected contact being loose and is uncommon in experiments. However, the two pairs of the VC and CMW2 could prove the synchronicity between the happening of CMW2 and the sudden shift of the contact voltage.

Figure 14:
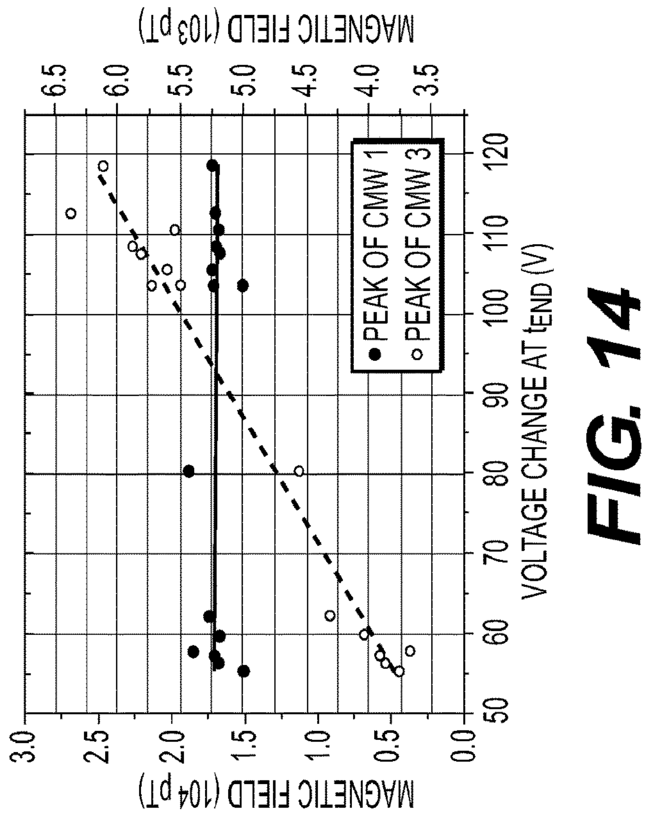
FIG. 14 is a plot of peak values of selected characteristic magnetic waveforms and the amplitude of a voltage change VC at an end time of a magnetic waveform according to certain implementations of this disclosure.
Figure 15:
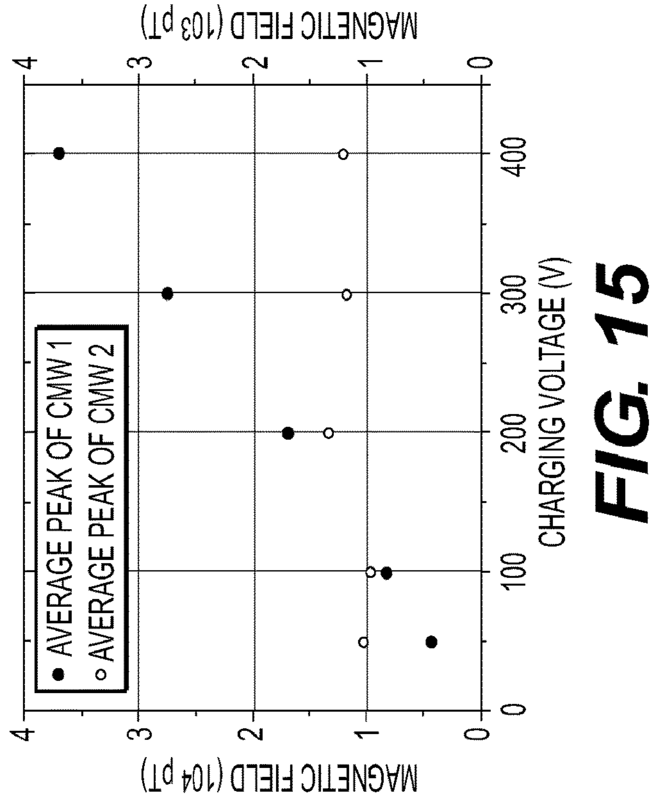
FIG. 15 is a plot of average peak values of selected characteristic magnetic waveforms under different charging voltages.

Repeated experiments show that the amplitude of VC at $t_{start}$ equals to the charging voltage, and VC at $t_{end}$ will change when $t_{cs}$ is different, but VC at $t_{cs}$ is always the same because the arc voltage of the VI doesn't change. This allows to further confirm that CMWs are caused by the contact voltage change (electric field change). FIG. 14 shows the relationship between the peak of CMW1 and 3 and the amplitude of VC at $t_{start}$ and $t_{end}$. In these tests, the charging voltage remains 200 V (VC at $t_{start}$ is unchanged), and the peak of the current remains 800 A, but the contact separation time will change in each test (VC at $t_{end}$ will be different). It is clear that the peak value of CMW3 increases with the growth of the VC amplitude at $t_{end}$. However, the peak of CWM1 is almost unchanged since VC amplitude at $t_{start}$ remains 200 V (same as the charging voltage). Various charging voltages are applied to achieve different VC amplitude at $t_{start}$, and 15 tests under each voltage are conducted. FIG. 15 draws the average peak of CMW1 under different charging voltages. According to the figure, the peak of CMW1 increases almost linearly with the charging voltage (the VC amplitude at $t_{start}$). To summarize, the larger the VC, the higher the peak of CWM1 and 3, and this dependence supports the conclusion that CMW1 and 3 are caused by the electric field change due to the contact voltage change at $t_{start}$ and $t_{end}$.

Figure 16:
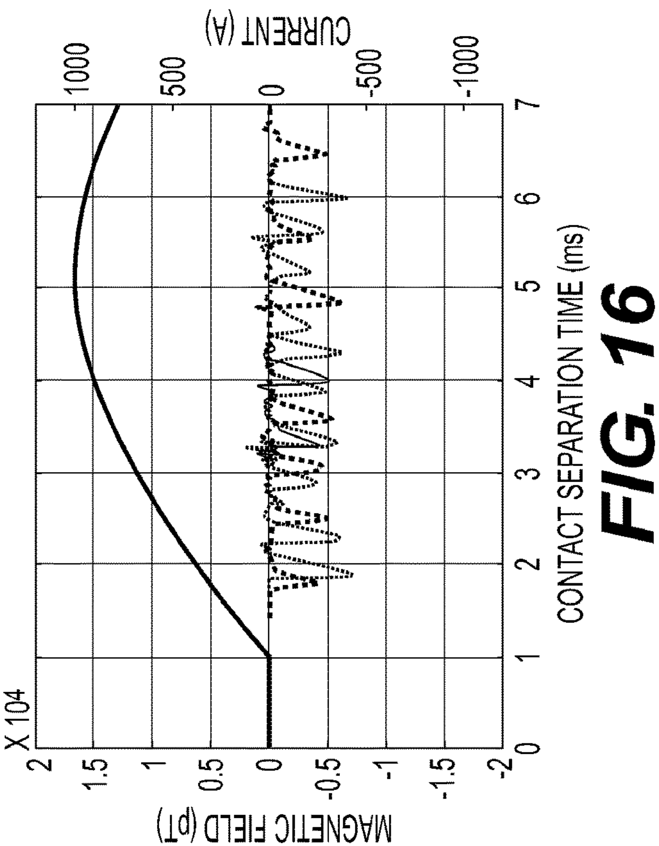
FIG. 16 is a plot of multiple instances of a characteristic magnetic waveform from multiple tests such as a sample of 20 tests according to implementations of this disclosure.

In the previous section, the CMW2 is attributed to the change of both current distribution and electric field due to the contact separation. However, the independence of the peak of CMW2 on the charging voltage which is also shown in FIG. 16 disagrees with this statement. If the change of voltage and current distribution equally contributes to CMW2, its waveform should vary as the current amplitude changes. Also, different contact separation times may lead to different arc initial states, such as the starting position, number of cathode spots, etc., so CMW2 may have different patterns. CMW2s from 20 different tests are plotted in FIG. 16. In each test, 1 kA (peak) current is cut off at different $t_{cs}$. These CMW2s are obtained by subtracting the experiment magnetic field from the circuit magnetic field, and they are drawn together according to their $t_{cs}$. Nevertheless, based on FIG. 15 and FIG. 16, neither the current amplitude nor the contact separation time makes an obvious impact on the waveform of CMW2 (shape, peak value, and duration), indicating that the influence of arc might be minor. Since the arc in an AMF VI is a cylindrical diffuse arc evenly distributed between the contacts, it is possible that the current distribution doesn't significantly change during the contact separation and leads to a less pronounced effect by the current. Therefore, the electric field change should be main cause of CMW2: since at $t_{cs}$ the arc initiates, the contact voltage difference suddenly shifts from zero to the arc voltage, and then the separation further results in the electric field change and cause CMW2. Moreover, because the arc voltage and the contact separating speed of the V1 won't change significantly, the shape of CMW2s remains similar.

Arc Duration Estimation and Circuit Breaker Operation Detection Based on CMWs. So far, the possible causes of CMWs are discussed. To step further, it is of more significance to relate CMWs with some specific events during load switching. Based on the previous analysis, the CMW1 at $t_{start}$ co-occurs with the "start of current", the CMW2 at $t_{cs}$ co-occurs with the opening of VI (contact separation), and the CMW3 at $t_{end}$ co-occurs with arc extinction. Therefore, these CMWs could be considered as the indicator of these events: 1) current starts to flow through circuit breaker, 2) circuit breaker opens/the arc initiates, and 3) the arc extinction in circuit breaker. Since in the real case the "current start" means the circuit breaker is closed and the arc extinction means the line is successfully cut off, it is feasible to identify when the circuit breaker closes or opens and when the load is cut off by recognizing particular magnetic signatures. Moreover, the arc duration could be calculated by determining the delay between the arc extinction and the opening of the circuit breaker.

Based on the above discussion, a non-invasive method (based on CMWs in the magnetic field) to estimate the arc duration and detect vacuum circuit breaker operations is established. In non-limiting embodiments, the method may include the following procedures:

Step 1: Relate CMWs with circuit breaker operations including single spiking at the close of VI and a notch following a spiking at the opening of VI.

Step 2: Measure the magnetic field

Step 3: Recognize CMWs from the measurements

Step 4: Calculate arc duration and identify operations of VI, where arc duration=$t_{end}$–$t_{cs}$.

Circuit Magnetic Field. FIG. 11 shows the magnetic field signal when the VI does not open. Since this disclosure focuses on the magnetic field of the circuit breaker during load switching, it is necessary first to record the magnetic field of the test circuit with no current interruption. Then, the change in the magnetic field due to the arc could be studied. For convenience, the waveform of FIG. 11 with no current interruption may be referred to as "the circuit magnetic field", and the magnetic field during the load switching is "the experiment magnetic field".

General Characteristics of Vacuum Circuit Breaker Magnetic Field during Load Switching. FIG. 12 plots the current, the voltage between two contacts, the contact voltage to ground, the experiment magnetic field, and the circuit magnetic field. As shown, the experiment magnetic field is the solid line, and the circuit magnetic field is the dash line. The current and voltages are the dot, dash, and solid lines as. Some "times" are also marked in the figure based on the current and voltage waveform to facilitate the discussion of the magnetic field.

$t_{start}$: this is the current starting time. The output switches close at this time, and the current begins to flow through the VI. Before $t_{start}$, the circuit is open, and the current is zero. The contact voltage to ground has a sudden change at $t_{start}$, because the contact is connected to the charged capacitor when the LC circuit is formed, and thus see the charging voltage of the capacitor.

$t_{cs}$: this is when the contacts of the VI open, i.e., "contact separation time". The arc initiates at this moment. Determination of this time depends on the voltage between two contacts (voltage with smaller amplitude). It can be observed that voltage remains zero at the beginning and then shifts to a specific voltage at about 5 ms. This voltage shift represents contact separation since the voltage should remain zero if the contacts are firmly closed. The voltage shift is 12 V, which is the arc voltage. In experiments using this VI, the arc voltage remains the same. The same voltage change also occurs in the voltage to ground. This is because the sudden onset of the arc voltage causes the ground potential of the contact to be raised.

$t_{end}$: the current returns to zero at this time and no longer changes. When the current decreases to zero, the arc is extinguished. Therefore, no current flows through the VI because of the open circuit. In experiments of this paper, since contacts separate in the first half cycle and no re-ignition of arc occurs, this time is always the first zero-crossing point of the current waveform. It is observed that a voltage change occurs at tend. Since the circuit is open after extinguishing the arc, the voltage between contacts becomes the voltage difference between two parts of the capacitor bank instead of the arc voltage. Transient recovery voltage can be observed in some tests during this voltage change.

Based on these times of incidence, the experiment magnetic field can be divided into four stages for discussion: 1) before the current, 2) current time, 3) arcing time/arc duration, 4) after the arc. First, before $t_{start}$, no current flows through the electric circuit, and no significant electric field changes happen, so the magnetic field remains zero. The second stage is from $t_{start}$ to $t_{cs}$, and the current starts to flow through the VI during this period. A spiking waveform can be observed at the $t_{start}$. In this stage, the circuit magnetic field and the experimental magnetic field are coincidental because their current distributions (path, direction, and density) in space are same before the contact separation. The third stage starts with the contact separation which causes the arc initiation at $t_{cs}$. Due to the contact separation and existence of arc, the current distribution in space may change. Moreover, since the contacts of vi have a voltage difference (arc voltage) now, the separating movement of the two contacts will change the electric field, i.e., the derivative of electric displacement vector D is nonzero. Therefore, from $t_{cs}$, the experiment magnetic field becomes different from the circuit magnetic field. It is noticeable that a notch waveform occurs exactly at $t_{cs}$, and it could be caused by the change of both current distribution and electric field during the contact separation. The last stage is after $t_{end}$. Again, a spiking waveform can be seen at the beginning of this period, and its shape is very similar to the one at $t_{start}$. Since the arc has been extinguished and current no longer exists in the electric circuit, this spiking in the magnetic field can only be induced by the change of the electric field. The fast voltage change at $t_{end}$ may support this hypothesis.

Extraction and Analysis of Characteristic Magnetic-field Waveforms. To investigate the magnetic signature of VI during load switching with more detail, three characteristic magnetic-field waveforms (CMWs) that appear in the experiment magnetic field at the three "times" mentioned above are extracted: 1) CMW1: Spiking waveform at $t_{start}$, 2) CMW2: Notch waveform at $t_{cs}$, 3) CMW3: Spiking waveform at tend. Their physical meanings are studied then.

FIG. 13 reveals the time relationship between the CMWs and the change of the contact voltage. In FIG. 13, abrupt changes in the contact voltage could be observed both at $t_{start}$ and $t_{end}$, and the CMW1 and 3 appear correspondingly when the voltage change happens. As analyzed in the last section, because of the absence of current, CMW3 is caused by the electric potential change. Since the current just starts at $t_{start}$, CMW1, with a similar shape to CMW3, could also be contributed by the derivative of D due to the sudden voltage change (VC). Further, since the VC is greater at $t_{start}$, the peak of CMW1 is much higher than CMW3. Moreover, it is noticed that CMW2 co-occurs with the contact voltage shift at $t_{cs}$. A weaker notch waveform and a smaller VC before $t_{cs}$ have also been recorded. This is caused by an unexpected contact loose and is uncommon in experiments. However, the two pairs of the VC and CMW2 could prove the synchronicity between the happening of CMW2 and the sudden shift of the contact voltage.

Repeated experiments show that the amplitude of VC at $t_{start}$ equals to the charging voltage, and VC at $t_{end}$ will change when $t_{cs}$ is different, but VC at $t_{cs}$ is always the same because the arc voltage of the VI doesn't change. This allows to further confirm that CMWs are caused by the contact voltage change (electric field change). FIG. 14 shows the relationship between the peak of CMW1 and 3 and the amplitude of VC at $t_{start}$ and $t_{end}$. In these tests, the charging voltage remains 200 V (VC at $t_{start}$ is unchanged), and the peak of the current remains 800 A, but the contact separation time will change in each test (VC at $t_{end}$ will be different). It is clear that the peak value of CMW3 increases with the growth of the VC amplitude at $t_{end}$. However, the peak of CWM1 is almost unchanged since VC amplitude at $t_{start}$ remains 200 V (same as the charging voltage). Various charging voltages are applied to achieve different VC amplitude at $t_{start}$, and 15 tests under each voltage are conducted. FIG. 15 draws the average peak of CMW1 under different charging voltages. According to the figure, the peak of CMW1 increases almost linearly with the charging voltage (the VC amplitude at $t_{start}$). To summarize, the larger the VC, the higher the peak of CWM1 and 3, and this dependence supports the conclusion that CMW1 and 3 are caused by the electric field change due to the contact voltage change at $t_{start}$ and $t_{end}$.

In the previous section, the CMW2 is attributed to the change of both current distribution and electric field due to the contact separation. However, the independence of the peak of CMW2 on the charging voltage which is also shown in FIG. 16 disagrees with this statement. If the change of voltage and current distribution equally contributes to CMW2, its waveform should vary as the current amplitude changes. Also, different contact separation times may lead to different arc initial states, such as the starting position, number of cathode spots, etc., so CMW2 may have different patterns. CMW2s from 20 different tests are plotted in FIG. 16. In each test, 1 kA (peak) current is cut off at different $t_{cs}$. These CMW2s are obtained by subtracting the experiment magnetic field from the circuit magnetic field, and they are drawn together according to their $t_{cs}$. Nevertheless, based on FIG. 15 and FIG. 16, neither the current amplitude nor the contact separation time makes an obvious impact on the waveform of CMW2 (shape, peak value, and duration), indicating that the influence of arc might be minor. Since the arc in an AMF VI is a cylindrical diffuse arc evenly distributed between the contacts, it is possible that the current distribution doesn't significantly change during the contact separation and leads to a less pronounced effect by the current. Therefore, the electric field change should be main cause of CMW2: since at $t_{cs}$ the arc initiates, the contact voltage difference suddenly shifts from zero to the arc voltage, and then the separation further results in the electric field change and cause CMW2. Moreover, because the arc voltage and the contact separating speed of the VI won't change significantly, the shape of CMW2s remains similar.

Arc Duration Estimation and Circuit Breaker Operation Detection Based on CMWs. So far, the possible causes of CMWs are discussed. To step further, it is of more significance to relate CMWs with some specific events during load switching. Based on the previous analysis, the CMW1 at $t_{start}$ co-occurs with the "start of current", the CMW2 at $t_{cs}$ co-occurs with the opening of VI (contact separation), and the CMW3 at $t_{end}$ co-occurs with arc extinction. Therefore, these CMWs could be considered as the indicator of these events: 1) current starts to flow through circuit breaker, 2) circuit breaker opens/the arc initiates, and 3) the arc extinction in circuit breaker. Since in the real case the "current start" means the circuit breaker is closed and the arc extinction means the line is successfully cut off, it is feasible to identify when the circuit breaker closes or opens and when the load is cut off by recognizing particular magnetic signatures. Moreover, the arc duration could be calculated by determining the delay between the arc extinction and the opening of the circuit breaker.

Based on the above discussion, a non-invasive method (based on CMWs in the magnetic field) to estimate the arc duration and detect vacuum circuit breaker operations is established. The method has the following procedures. At a first step, this disclosure relates CMWs with circuit breaker operations in that there is a first spiking at the close of the vacuum interrupter VI. A notch follows the first spiking at the opening of VI. By measuring the magnetic field, the method recognizes CMWs from the measurements, allowing for calculating arc duration and identifying operations of VI. The arc duration=$t_{end}$–$t_{cs}$.

Figure 17:
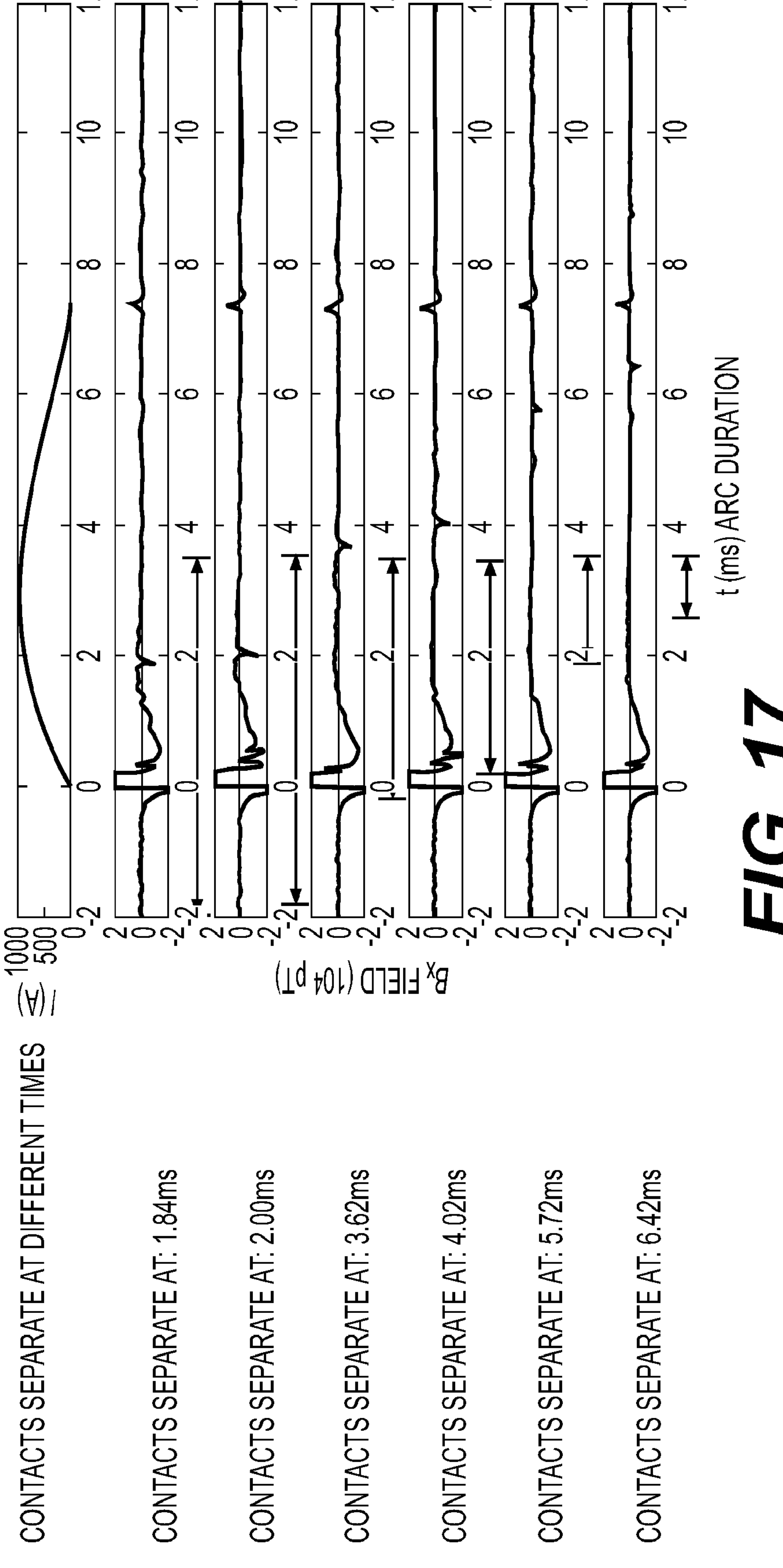
FIG. 17 is a series of plots of a circuit breaker response used to determine arc duration from magnetic signatures with contact separation at multiple points in time according to certain implementations of this disclosure.
Figure 18B:
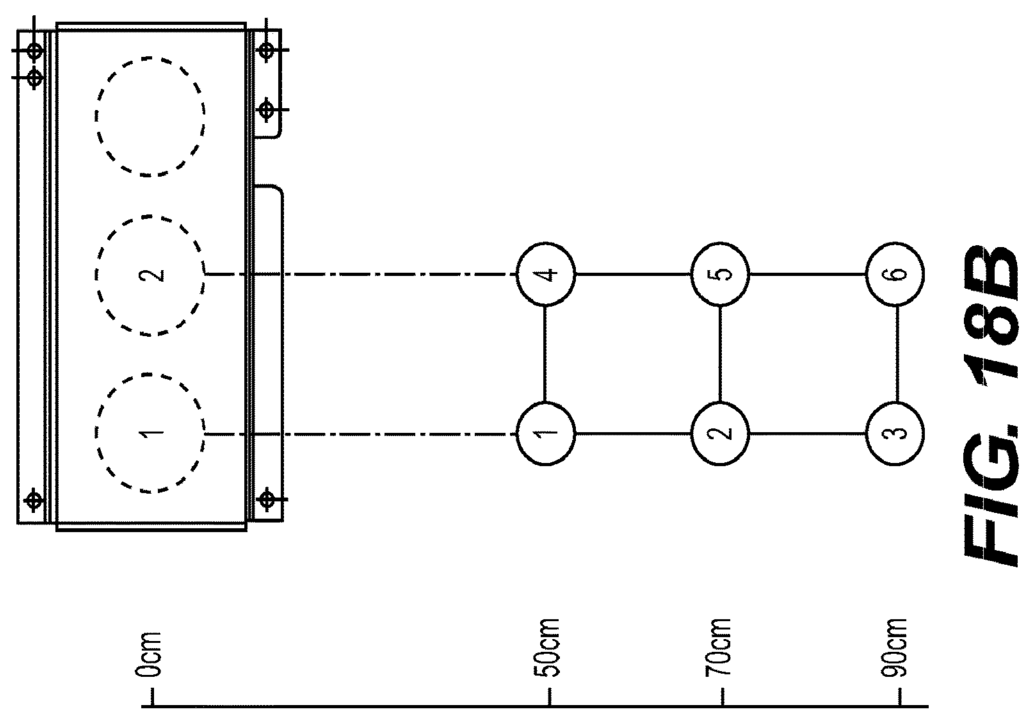
FIG. 18B is a schematic illustration of voltage interrupter response from multiple locations for sensing circuits according to implementations of this disclosure.
Figure 18A:
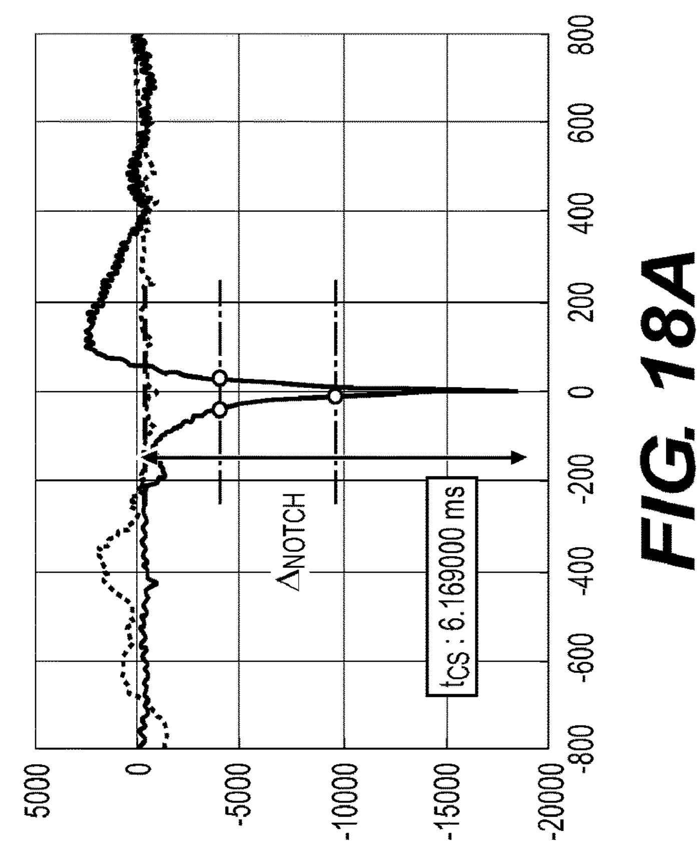
FIG. 18A is a plot schematically illustrating an influence of location on magnetic signatures for sensor circuits and circuit breakers in multiple locations. The plot indicates an extraction of the changes in the notch waveform for respective locations.
Figures 19A, 19B, 19C, 19D, 19E, 19F:
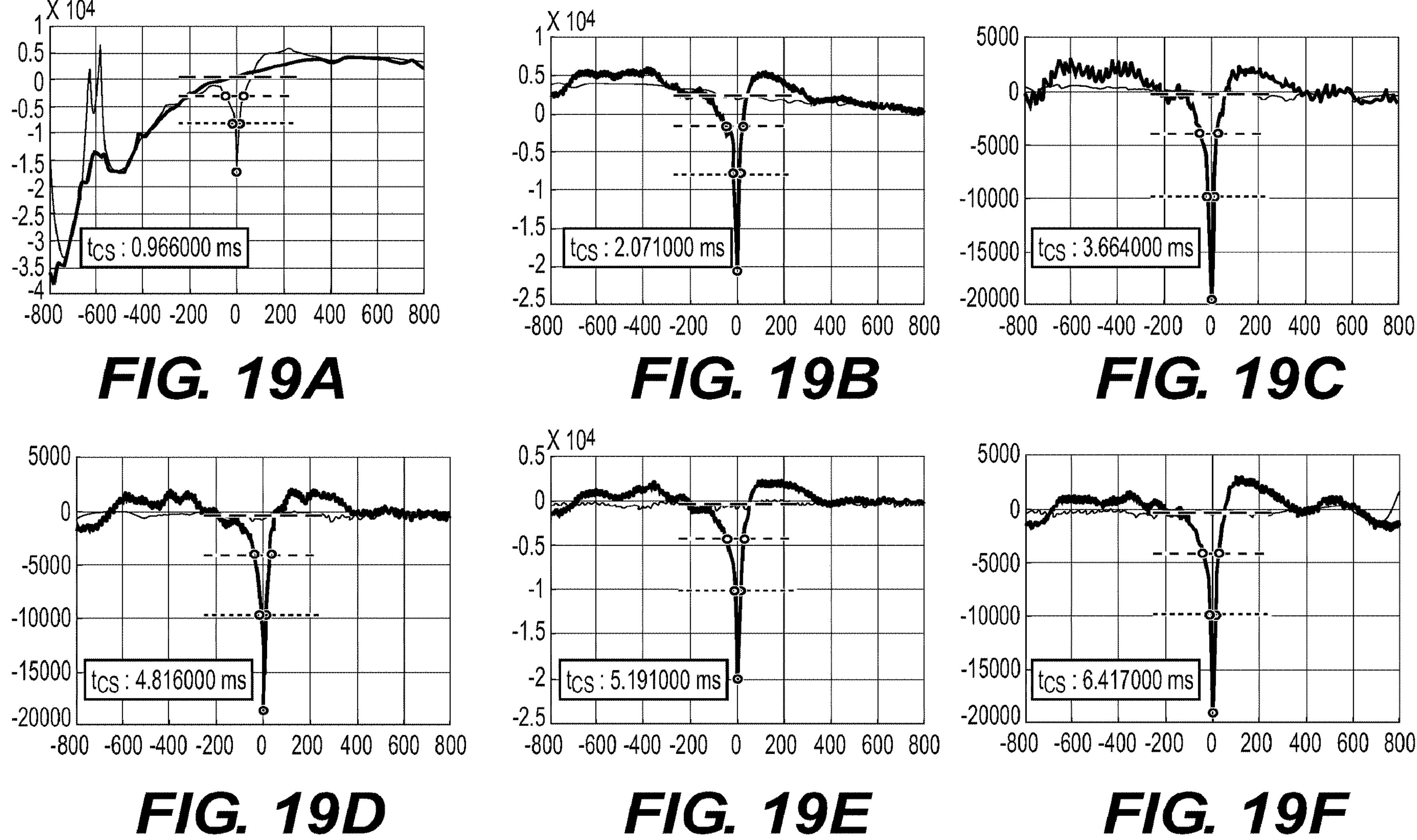
FIG. 19A is a plot of a representative notch waveform in the x-direction for an embodiment of this disclosure.
FIG. 19B is a plot of a representative notch waveform in the x-direction for an embodiment of this disclosure.
FIG. 19C is a plot of a representative notch waveform in the x-direction for an embodiment of this disclosure.
FIG. 19D is a plot of a representative notch waveform in the x-direction for an embodiment of this disclosure.
FIG. 19E is a plot of a representative notch waveform in the x-direction for an embodiment of this disclosure.
FIG. 19F is a plot of a representative notch waveform in the x-direction for numerous embodiments of this disclosure.
Figures 20A, 20B, 20C, 20D:
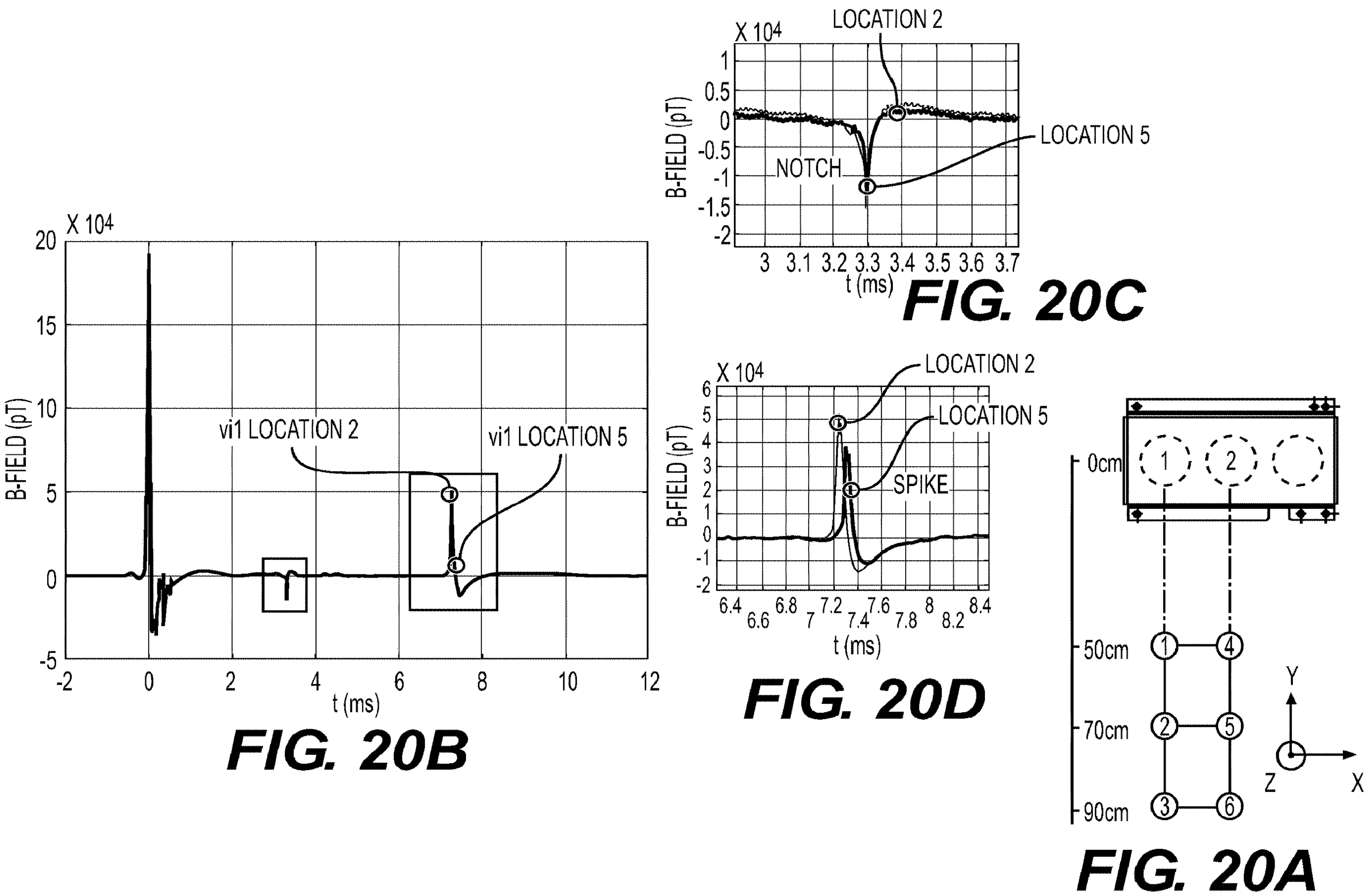
FIG. 20A is a schematic diagram for illustrating an influence of location on magnetic signatures for sensor circuits and circuit breakers in multiple locations.
FIG. 20B is a plot that indicates an extraction of the changes in the notch waveform the second spiking waveform for respective locations.
FIG. 20C is an expanded plot of a notch waveform from FIG. 20B.
FIG. 20D is an expanded plot of a second spiking waveform for FIG. 20B.
Figure 21A:
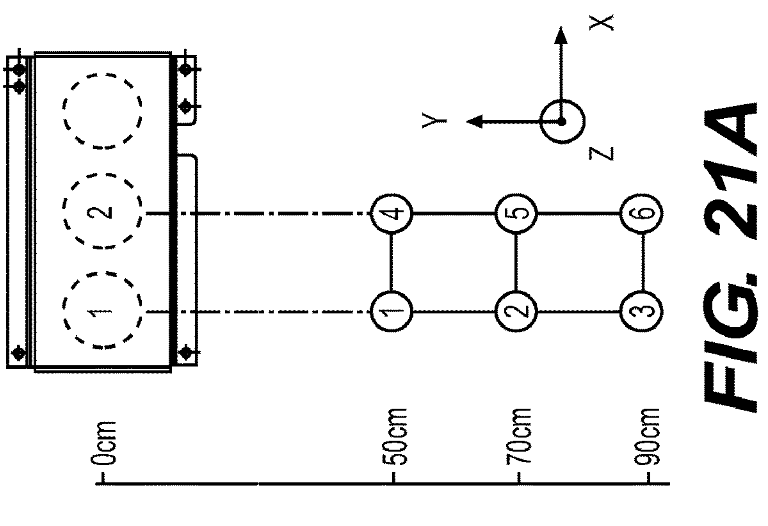
FIG. 21A is a schematic diagram for illustrating an influence of location on magnetic signatures for sensor circuits and circuit breakers in multiple locations.
Figure 21C:
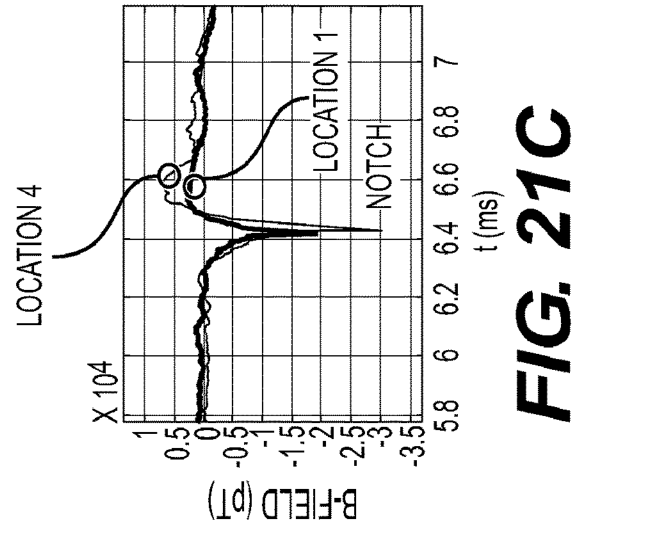
FIG. 21C is an expanded plot of a notch waveform from FIG. 21B.
Figure 21D:
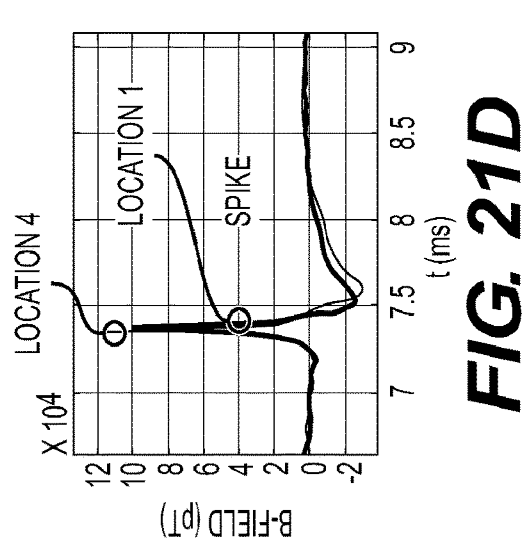
FIG. 21D is an expanded plot of a second spiking waveform for FIG. 21B.
Figure 21B:
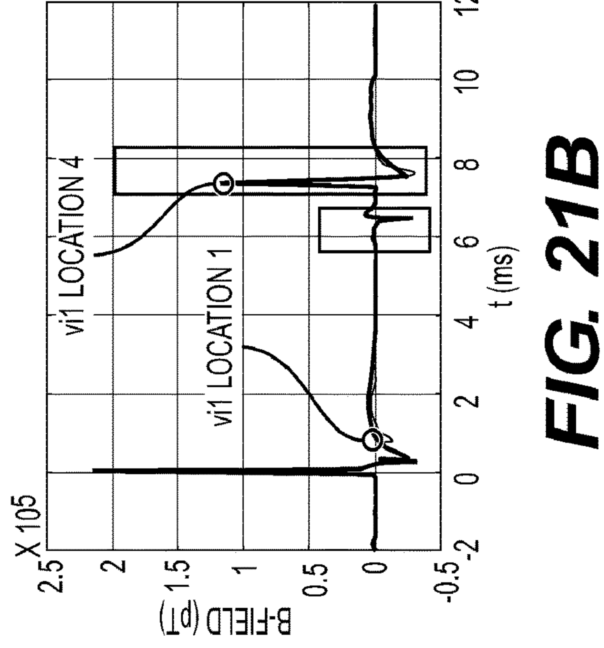
FIG. 21B is a plot that indicates an extraction of the changes in the notch waveform the second spiking waveform for respective locations.
Figures 22A, 22B, 22C, 22D:
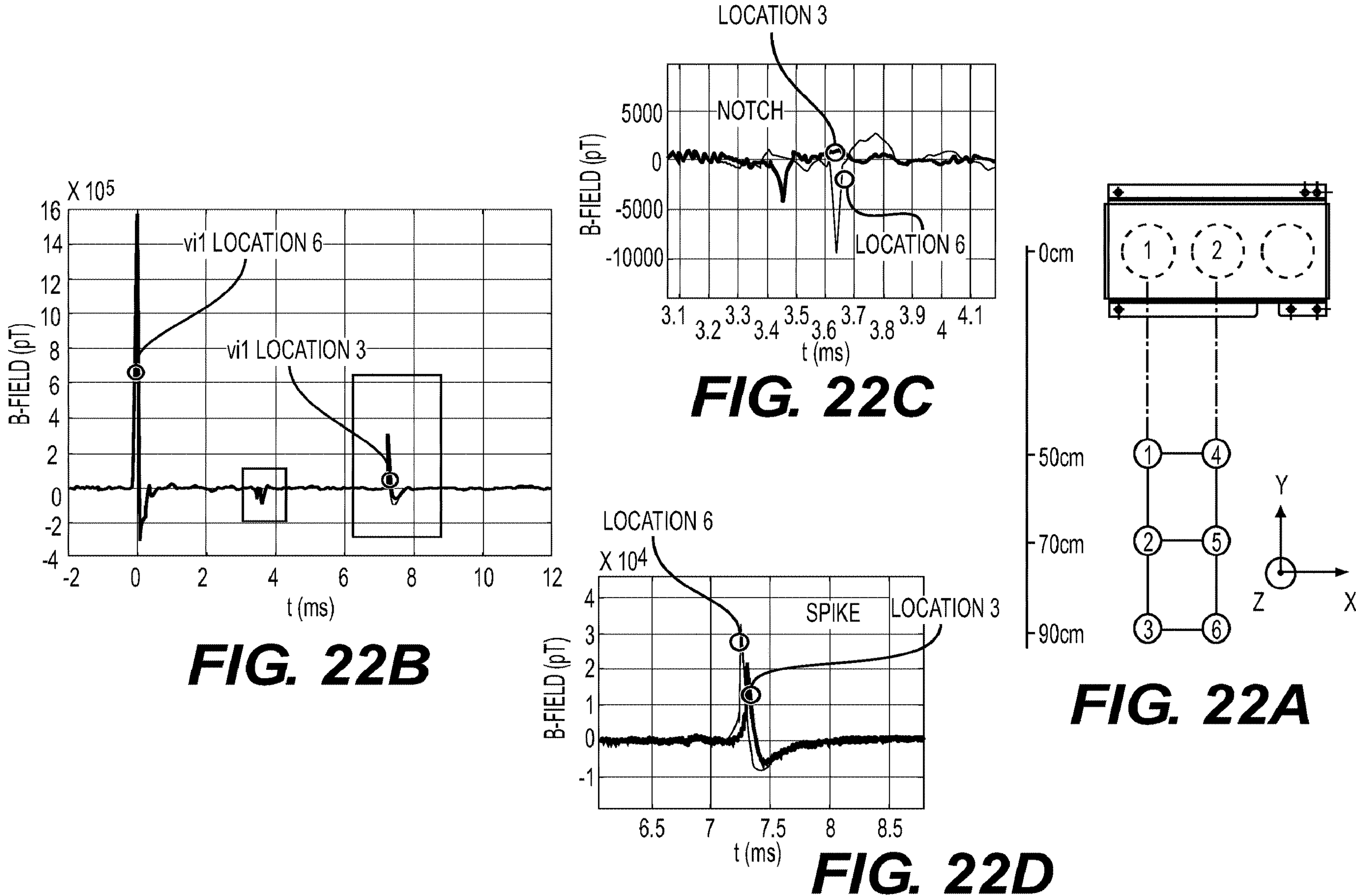
FIG. 22A is a schematic diagram for illustrating an influence of location on magnetic signatures for sensor circuits and circuit breakers in multiple locations.
FIG. 22B is a plot that indicates an extraction of the changes in the notch waveform the second spiking waveform for respective locations.
FIG. 22C is an expanded plot of a notch waveform from FIG. 21B.
FIG. 22D is an expanded plot of a second spiking waveform for FIG. 21B.

Additional aspects of this disclosure are shown schematically in FIGS. 17-22. For example, FIG. 17 illustrates the use of characteristic magnetic waveforms to determine arc duration at various contact separation times for a given circuit breaker. FIGS. 18-22 are illustrations that show the various waveforms for use in identifying particular low frequency magnetic signature responses for circuit breakers and sensing circuits in different locations. For example, FIGS. 18A and 18B illustrate how the changes in notch waveforms vary when the test circuit included vacuum interrupters 1 and 2 located at various distances and positions from sensing circuits and coil antennas 1-6. In this illustration, the plot emphasizes changes in the notch waveform by taking repeat experiments at each location 1-6, taking the average of the B-field at each location, find the contact separation time $t_{cs}$ for each measurement, and take an average of the 0.25 ms B-field before and after the contact separation time (the black dash). This allows for calculation of how the notch waveform changes by location. In fact, this disclosure shows that the magnitude of the change in the notch (delta notch) depends on the distance between the antenna and the vacuum interrupter, (i.e., the closer the distance the larger the amplitude according to a fitting curve). FIGS. 19A-19C show series of notch waveforms for numerous relative locations between the voltage interrupters and the coil antennas. FIGS. 20A-20D illustrate the different notch wave form and second spiking waveform for selected locations of coil antennas relative to a given vacuum interrupter by using techniques described herein. In particular, FIGS. 20C and 20D plot notch and second spike waveforms for each vacuum interrupter relative to location 2 and location 5 for the coil antennas. FIGS. 21A-21D also illustrate the different notch wave form and second spiking waveform for selected locations of coil antennas relative to a given vacuum interrupter by using techniques described herein. In particular, FIGS. 21C and 21D plot notch and second spike waveforms for each vacuum interrupter relative to location 1 and location 4 for the coil antennas. FIGS. 22A-22D also illustrate the different notch wave form and second spiking waveform for selected locations of coil antennas relative to a given vacuum interrupter by using techniques described herein. In particular, FIGS. 22C and 22D plot notch and second spike waveforms for each vacuum interrupter relative to location 3 and location 6 for the coil antennas.

Considering the figures, the above detailed description and the claims below at once, in one implementation, an apparatus 105 gathers magnetic field data associated with at least one circuit breaker 175 connected to a power circuit 105. The apparatus includes at least one coil antenna 120 positioned in a location relative to the at least one circuit breaker to sense changes in a magnetic field around the coil antenna, wherein the changes in the magnetic field induce corresponding changes to a current and voltage on the coil antenna. A receiver 130 connected to the at least one coil antenna 120 receives the current or the voltage from the coil antenna. An analog to digital converter 135 receives the current or the voltage and generates a digital output tracking the changes to the current caused by the magnetic field around the coil antenna 120. A computer 140 having a processor and computer memory is connected to the analog to digital converter 135 and stores the digital output in the computer memory, wherein the computer memory accesses software implemented by the processor to generate a plurality of characteristic magnetic field waveforms 211, 213, 215, 801, 802, 803 of the magnetic field data for the at least one circuit breaker 175, 975.

In another implementation, the coil antenna 120 includes respective wire coils 122 positioned to sense an x, y, or z component of the magnetic field around the coil antenna, and the computer generates, in the time domain, a designated waveform signature 200 for a respective x, y, or z component of the magnetic field, and wherein the designated waveform signature 200 is a compilation of at least some of the plurality of characteristic magnetic field waveforms 211, 213, 215, 801, 802, 803.

In another implementation, the respective x, y, or z component of the magnetic field induces changes to a corresponding current and a corresponding voltage on a respective wire coil 122 according to changes in a power circuit current across the at least one circuit breaker 175, 9785 during a load switching operation on the power circuit 105.

In another implementation, the plurality of characteristic magnetic field waveforms includes a spiking waveform 211, 801 a notch waveform 213, 802 and a second spiking waveform 215, 803 during respective time periods 205, 210, 215 corresponding to a load switching operation across the at least one circuit breaker.

In another implementation, the spiking waveform 211, 801 includes an increase or a decrease in the magnetic field around the coil antenna 120, wherein the increase or decrease corresponds to changes in power circuit current across contacts 115A, 115B of the at least one circuit breaker in a closed position.

In another implementation, the notch waveform 213, 802 includes an increase or a decrease in the magnetic field around the coil antenna 120 corresponding to an electrical arc formation at the at least one circuit breaker upon the at least one circuit breaker opening during the load switching operation.

In another implementation, the second spiking waveform 215, 803 includes a second increase or decrease in the magnetic field around the coil antenna 120 at a determined time after a notch signature time span 210, wherein the second increase in the magnetic field corresponds to an extinguishment of an electrical arc formed across the at least one circuit breaker upon the circuit breaker opening.

In another implementation, the apparatus further includes an amplifier 125 receiving the current and transmitting the current to the receiver 130, and the receiver further includes a low pass filter 610 and a Butterworth high pass filter 615 connected to the analog to digital converter 135, 635.

In another implementation, the at least one coil antenna 120 includes the three orthogonal air-core loop antennas sampling the x, y and z component of the magnetic field.

In another implementation, the receiver 130 includes a sensitivity to a minimum magnetic field of about 10 nT/sqrt (Hz).

In another implementation, the receiver 130 includes a sensitivity to a minimum magnetic field of about 1 fT/sqrt (Hz).

In another implementation, the receiver 130 has an operating frequency within a range of about 1 kHz to about 500 kHz.

In another implementation, the receiver 130 has an operating frequency of about 60 Hz.

In another implementation, the computer 140 and the software are configured to distinguish respective characteristic magnetic waveforms 211, 213, 215, 801, 802, 803 of the magnetic field data for individual circuit breakers according to the relative locations of the at least one coil antenna and the individual circuit breakers.

In one implementation, a system of tracking load switching operations and fault clearing operations of at least one circuit breaker in a power circuit 105 includes at least one coil antenna 120 sensing changes in a magnetic field around the coil antenna. The changes in the magnetic field induce corresponding changes to a current or voltage in the at least one coil antenna. A receiver 130 is connected to the at least one coil antenna 120 and receives the current or voltage. A computer 140 is connected to the receiver and stores a data stream that corresponds to the changes in magnetic field around the at least one coil antenna. The computer uses the data stream to generate a plurality of characteristic magnetic field waveforms 211, 213, 215, 801, 802, 803 for the at least one circuit breaker. The computer 140 assembles a low frequency magnetic signature for a respective circuit breaker from the characteristic magnetic field waveforms generated for the respective circuit breaker.

In another implementation of the system, the computer 140 distinguishes a magnetic signature for the respective circuit breaker by the respective locations of the at least one coil antenna and the respective circuit breaker.

In another implementation of the system, the plurality of characteristic magnetic field waveforms 211, 213, 215, 801, 802, 803 includes a spiking waveform 211, 801, a notch waveform 213, 802, and a second spiking waveform 215, 803 during a time period corresponding to a load switching operation across the at least one circuit breaker In another implementation of the system, the time period includes a start time initiating the spiking waveform 211, 801, and the start time corresponds to an increase, from zero, in a sensed magnetic field around the coil antenna 120, wherein the increase in the magnetic field results from a respective increase in power circuit current across the respective circuit breaker in a closed position.

In another implementation of the system, the spiking waveform 211, 801 terminates when the magnetic field drops from a spiking maximum value 218 to a local minimum value 261 for the spiking waveform.

In another implementation, the time period comprises a contact separation time initiating the notch waveform 213, 802, wherein the contact separation time corresponds to an increase or a decrease in the magnetic field around the coil antenna 120 from the local minimum value of the spiking waveform 261 to a different value corresponding to an electrical arc formed at the respective circuit breaker upon the respective circuit breaker opening during the load switching operation. For instances of a "negative" or "decreasing" notch, the contacts open at odd half cycles ($1^{st}$, $3^{rd}$, $5^{th}$) and for instances of a "positive" or increasing notch, the contacts open at even half cycles ($2^{nd}$, $4^{th}$, $6^{th}$).

In another implementation, the notch waveform 213, 802 terminates when the change in the magnetic field drops to a local minimum value 262 in magnitude for the notch waveform.

In another implementation, the time period includes an end time initiating the second spiking waveform 215, 803, wherein the end time corresponds to a change back to zero in the magnetic field around the coil antenna 120 from the local minimum value 262 of the notch waveform, corresponding to extinction of the electrical arc at the respective circuit breaker upon the respective circuit breaker remaining open during the load switching operation. In some embodiments, such as a designated normal case, the time difference between the contact separation time and the end time is less than a half cycle (8 ms), but if the load is not interrupted successfully, the time difference can become longer. In instances of positive spiking, the current ends at odd half cycles ($1^{st}$, $3^{rd}$, $5^{th}$) and for negative spiking, the current ends at even half cycles ($2^{nd}$, $4^{th}$, $6^{th}$).

In another implementation, the second spiking waveform 215, 803 terminates when a sensed magnetic field around the coil antenna 120 increases from zero.

In another implementation, a computer implemented method of tracking load switching operations or fault clearing operations of at least one circuit breaker in a power circuit has steps including positioning at least one coil antenna 120 in proximity to the at least one circuit breaker 175; sensing changes in a magnetic field around the at least one coil antenna 120, wherein the changes in the magnetic field correspond to the load switching operations at the at least one circuit breaker and induce corresponding changes to a current or a voltage in the at least one coil antenna; transmitting the current or the voltage from the at least one coil antenna to a receiver; converting the current or the voltage that is input from the at least one coil antenna to a magnetic field data stream tracking the magnetic field in the time domain; and using a computer having a processor and computer memory to store the data stream in the computer memory. The computer generates a plurality of characteristic magnetic field waveforms 211, 213, 215, 801, 802, 803 for the at least one circuit breaker.

In another implementation, the method further includes a step of assembling a low frequency magnetic signature 200 for a respective circuit breaker from the characteristic magnetic field waveforms 211, 213, 215, 801, 802, 803 generated for the respective circuit breaker.

In another implementation, the method includes assembling characteristic magnetic field waveforms 211, 213, 215, 801, 802, 803 for a spiking waveform 211, 801, a notch waveform 213, 802, and a second spiking waveform 215, 803 during a time period corresponding to the load switching operation across the respective circuit breaker.

In another implementation, the time period of the method includes a start time initiating the spiking waveform 215, 803, and the computer 140 triggers the start time upon an increase, from zero, in a sensed magnetic field around the coil antenna 120, and wherein the increase in the magnetic field results from a respective increase in power circuit current across the respective circuit breaker in a closed position.

In another implementation of the method, the computer terminates the spiking waveform 215, 803 when the magnetic field drops from a spiking maximum value 867 to a local minimum value 869 for the spiking waveform. In another implementation, the time period includes a contact separation time initiating the notch waveform, wherein the computer triggers the contact separation time upon an increase or a decrease in the magnetic field around the coil antenna from the local minimum value of the spiking waveform to a different value corresponding to an electrical arc formed at the respective circuit breaker upon the respective circuit breaker opening during the load switching operation.

In another implementation, the computer terminates the notch waveform when the magnetic field drops to a local minimum value for the notch waveform.

In another implementation, the time period includes an end time initiating the second spiking waveform, wherein the computer triggers the end time upon an increase in the magnetic field around the coil antenna from the local minimum value of the notch waveform back to zero, corresponding to extinction of the electrical arc at the respective circuit breaker upon the respective circuit breaker remaining open during the load switching operation.

In another implementation, the second spiking waveform terminates when the sensed magnetic field around the coil antenna increases from zero.

The computer may be used to analyze the waveform and calculate the arc duration. In some embodiments, it may be independent from the substation or power circuit and does not have to send control signals to the breaker or any other device. The information is used to estimate the wear of the breaker and estimate its remaining life. It basically sums up the current-time integrals: Total wear over all switching events is:

$$\Sigma_{events}(\text{Integral } \int \text{ from } t_{arcstart} \text{ to } t_{arcend}) i^2(t)dt$$

Implementations described above and in relation to the figures may be used with equipment that implements computerized methods as described herein. In particular, the described equipment, communicate with a computer processor configured to process one or more characteristics and/or profiles of the electrical signals received.

The system may include a computing unit, a system clock, an output module and communication hardware. In its most basic form, the computing unit may include a processor and a system memory. The processor may be a standard programmable processor that performs arithmetic and logic operations necessary for operation of the system. The processor may be configured to execute program code encoded in tangible, computer-readable media. For example, the processor may execute program code stored in the system memory, which may be volatile or non-volatile memory. The system memory is only one example of tangible, computer-readable media. In one aspect, the computing unit can be considered an integrated device such as firmware. Other examples of tangible, computer-readable media include floppy disks, CD-ROMs, DVDs, hard drives, flash memory, or any other machine-readable storage media, wherein when the program code is loaded into and executed by a machine, such as the processor, the machine becomes an apparatus for practicing the disclosed subject matter.

Any combination of one or more computer readable medium(s) may be utilized. The computer readable medium may be a computer-readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer-readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, radio frequency (RF), etc., or any suitable combination of the foregoing.

Computer program code for carrying out operations for aspects of the present invention may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the vehicle computer through any type of network, including a local area network (LAN) or a wide area network (WAN), or the connection may be made to an external computer (for example, through the Internet using an Internet Service Provider).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Some references, which may include various patents, patent applications, and publications, are cited in a reference list and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the $n^{th}$ reference in the list. All references cited and discussed in this specification are incorporated herein by reference in their entireties and to the same extent as if each reference was individually incorporated by reference.

Although example embodiments of the present disclosure are explained in some instances in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an," and "the" include plural referents unless the context clearly dictates otherwise. Ranges may be expressed herein as from "about" or "5 approximately" one particular value and/or to "about" or "approximately" another particular value. When such a range is expressed, other exemplary embodiments include from the one particular value and/or to the other particular value.

By "comprising" or "containing" or "including" is meant that at least the name compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" may be any applicable human, animal, or other organism, living or dead, or other biological or molecular structure or chemical environment, and may relate to particular components of the subject, for instance, specific tissues or fluids of a subject (e.g., human tissue in a particular area of the body of a living subject), which may be in a particular location of the subject, referred to herein as an "area of interest" or a "region of interest."

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5).

Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

REFERENCES

The references listed below are incorporated by reference into this disclosure as if set forth fully herein.

[1] M. A. Chapman, "Possibilities and limitations of radio-frequency measurement of arc duration in HVAC circuit breakers," Ph.D. dissertation, Dept. Info. Tech. and. Elect. Eng., ETH Zurich, Zurich, Switzerland, 2011.

[2] F. Si, C. Yundong, L. Kai, H. Chunguang and L. Jing, "Investigation on arcing behaviors in high-voltage switchgear with a rotary interruption technology," 2017 4th International Conference on Electric Power Equipment-Switching Technology (ICEPE-ST), 2017, pp. 616-619.

[3] T. Rettenmaier, V. Hinrichsen and E. Taylor, "Investigations on arc movement in vacuum interrupters by arc rotation measurements with external magnetic field sensors," 2014 International Symposium on Discharges and Electrical Insulation in Vacuum (ISDEIV), 2014, pp. 149-152.

[4] H. Janssen, V. Hinrichsen, E. D. Taylor and T. Rettenmaier, "Comparison of Arc Motion in Lifetime Sealed Vacuum Interrupters with Different Bottle Geometries," 2018 28th International Symposium on Discharges and Electrical Insulation in Vacuum (ISDEIV), 2018, pp. 263-266.

[5] H. Janssen, V. Hinrichsen, E. D. Taylor and T. Rettenmaier, "Comparison of Arc Motion in Different Lifetime Sealed Vacuum Interrupters With RMF Contacts," in IEEE Transactions on Plasma Science, vol. 47, no. 8, pp. 3525-3532 August 2019.

[6] N. Guo, K. Whitmore, M. Cohen, T. Shekari, R. Beyah, and L. Graber, "Magnetic Signature of Vacuum Interrupters during Load Switching," In Press. IEEE 40th Electrical Insulation Conference 2022, Knoxville, TN, 19-23 Jun. 2022.

[7] T. Shekari, C. Bayens, M. Cohen, L. Graber, and R. Beyah, "RFDIDS: Radio Frequency-based Distributed Intrusion Detection System for the Power Grid," Network and Distributed Systems Security (NDSS) Symposium, 2019.

[8] P. H. Roberts, An Introduction to Magnetohydrodynamics. London, United Kingdoms: Longmans, 1967.

[9] K. Nitta et al., "Three-dimensional magnetic field analysis of electrodes for VCBs [vacuum circuit breakers]," in IEEE Transactions on Power Delivery, vol. 12, no. 4, pp. 1520-1525 October 1997.

[10] Yi Wu, Mingzhe Rong, Jian Li and Jianyong Lou, "Calculation of electric and magnetic fields in simplified chambers of low-voltage circuit breakers," in IEEE Transactions on Magnetics, vol. 42, no. 4, pp. 1007-110 April 2006.

[11] J. Gonzalez, P. Freton, F. Reichert and D. Randrianarivao, "Turbulence and Magnetic Field Calculations in High-Voltage Circuit Breakers," in IEEE Transactions on Plasma Science, vol. 40, no. 3, pp. 936-945, March 2012.

[12] Y. Zhang, X. Yao, Z. Liu, Y. Geng and P. Liu, "Axial Magnetic Field Strength Needed for a 126-kV Single-Break Vacuum Circuit Breaker During Asymmetrical Current Switching," in IEEE Transactions on Plasma Science, vol. 41, no. 6, pp. 1670-1678 June 2013.

[13] L. Xiaozhao, Z. Yang, W. Yuhao, J. Lei and W. Zhengqi, "Magnetic Field Simulation Analysis of New Type Coil-type Axial Magnetic," 2020 IEEE International Conference on Advances in Electrical Engineering and Computer Applications (AEECA), 2020, pp. 337-340.

[14] B. U. Musa, W. H. Siew and M. D. Judd, "Computation of Transient Electromagnetic Fields Due to Switching in High-Voltage Substations," in IEEE Transactions on Power Delivery, vol. 25, no. 2, pp. 1154-1161 April 2010.

[15] R. S. Shi, A. Darcherif and J. C. Sabonnadiere, "Computation of transient electromagnetic fields radiated by a transmission line: An exact model," in IEEE Transactions on Magnetics, vol. 31, no. 4, pp. 2423-2431 July 1995.

[16] A. Diamantis and A. G. Kladas, "Mixed Numerical Methodology for Evaluation of Low-Frequency Electric and Magnetic Fields Near Power Facilities," in IEEE Transactions on Magnetics, vol. 55, no. 6, pp. 1-4, June 2019.

[17] J. Gonos et al., "Environmental Impact Analysis of Electric Power Lines," 2018 IEEE International Conference on Environment and Electrical Engineering and 2018 IEEE Industrial and Commercial Power Systems Europe (EEEIC/I&CPS Europe), 2018, pp. 1-5.

[18] N. Ari and W. Blumer, "Transient Electromagnetic Fields Due to Switching Operations in Electric Power Systems," in IEEE Transactions on Electromagnetic Compatibility, vol. EMC-29, no. 3, pp. 233-237, August 1987.

[19] M. Bosworth et al., "Modeling of Reaction Forces in High-Voltage Substation Structures," in IEEE Transactions on Power Delivery, vol. 33, no. 4, pp. 1510-1517 August 2018.

[20] M. A. Uman, D. K. McLain, and E. P. Krider, "The electromagnetic radiation from a finite antenna," in American Journal of Physics, vol. 43, no. 1, pp. 33-38, January 1975.

[21] B. Nekhoul, R. Feuillet, J. C. Sabonnadiere, L. Quinchon and F. Morillon, "Prediction of transient electromagnetic environment in power networks," in IEEE Transactions on Magnetics, vol. 30, no. 5, pp. 3745-3748 September 1994.

[22] M. Mohana Rao, M. J. Thomas and B. P. Singh, "Computation of EMI fields in a high voltage gas insulated substation during switching operations," 2003 IEEE Symposium on Electromagnetic Compatibility. Symposium Record (Cat. No. 03CH37446), 2003, pp. 743-748.

[23] M. B. Cohen et al., "Broadband longwave radio remote sensing instrumentation," in Review of Scientific Instruments, vol. 89, no. 9, September 2018.

[24] J. Heberlein, J. Mentel, and E. Pfender, "The anode region of electric arcs: A survey," in Journal of Physics D: Applied Physics, vol. 43, no. 2. December 2010.

[25] C. W. Kimblin, "Anode voltage drop and anode spot formation in dc vacuum arcs," in Journal of Applied Physics, vol. 40, no. 4, pp. 1744-1752 October 1969.

[26] I. I. Beilis, "Vacuum Arc Cathode Spot Theory: History and Evolution of the Mechanisms," in IEEE Transactions on Plasma Science, vol. 47, no. 8, pp. 3412-3433 August 2019.

[27] P. G. Slade, The vacuum interrupter: theory, design, and application. Boca Raton, FL, USA: CRC Press, 2008.

[28] P. G. Slade and M. D. Nahemow, "Initial Separation of Electrical Contacts Carrying High Currents," in Journal of Applied Physics, vol. 42, no. 9, pp. 3290-3297, 1971.

[29] J. V. R. Heberlein and J. G. Gorman, "The High Current Metal Vapor Arc Column between Separating Electrodes," in IEEE Transactions on Plasma Science, vol. 8, no. 4, pp. 283-288, 1980.

[30] P. Slade, "The Vacuum Interrupter Contact," in IEEE Transactions on Components, Hybrids, and Manufacturing Technology, vol. 7, no. 1, pp. 25-32, 1984.

[31] R. Haug and T. Kouakou, "Phenomena preceding arc ignition between opening contacts: experimental study and theoretical approach," Thirty-Sixth IEEE Conference on Electrical Contacts, and the Fifteenth International Conference on Electrical Contacts, 1990, pp. 543-549.

[32] M. Schulman, "Separation of spiral contacts and the motion of vacuum arcs at high AC currents," IEEE Transactions on Plasma Science, vol. 21, no. 5, pp. 484-488, 1993.

[33] K. Watanabe, E. Kaneko, and S. Yanabu, "Technological progress of axial magnetic field vacuum interrupters," IEEE Transactions on Plasma Science, vol. 25, no. 4, pp. 609-616, 1997.

[34] Y. Langlois, P. Chapelle, A. Jardy, and F. Gentils, "On the numerical simulation of the diffuse arc in a vacuum interrupter," in Journal of Applied Physics, vol. 109, no. 11, pp. 113306-01-113306-12, 2011.

[35] Y. Niwa, R. Palad, K. Sasage and W. Sakaguchi, "Vacuum arc behavior in transversal magnetic field electrode of Vacuum Interrupter," 2012 25th International Symposium on Discharges and Electrical Insulation in Vacuum (ISDEIV), 2012, pp. 505-508.

[36] M. Kim, K. Kim, A. Smajkic, M. Kapetanovic and M. Muratovic, "Influence of contact erosion on the state of SF6 gas in interrupter chambers of HV SF6 circuit breakers," 2014 IEEE International Power Modulator and High Voltage Conference (IPMHVC), 2014, pp. 466-469.

[37] M. Mohammadhosein, K. Niayesh, A. A. Shayegani-Akmal and H. Mohseni, "Online Assessment of Contact Erosion in High Voltage Gas Circuit Breakers Based on Different Physical Quantities," in IEEE Transactions on Power Delivery, vol. 34, no. 2, pp. 580-587, April 2019.

[38] M. Chapman, "Possibilities and limitations of radio-frequency measurement of arc duration in HVAC circiut breakers," Ph.D dissertation, ETH Zurich, 2011.

[39] Z. Wang, "Study on the Mechanisms and Prediction Methods of Arcing Contact Erosion of High-Voltage SF 6 Circuit Breaker". Ph.D dissertation, University of Liverpool, 2018.

[40] T. Cheng, W. Gao, W. Liu, and R. Li, "Evaluation method of contact erosion for high voltage SF6 circuit breakers using dynamic contact resistance measurement," in Electric Power Systems Research, vol. 163, part b, pp. 725-732, October 2018.

[41] T. S. Sidhu, G. Singh and M. S. Sachdev, "Microprocessor based instrument for detecting and locating electric arcs," in IEEE Transactions on Power Delivery, vol. 13, no. 4, pp. 1079-185 October 1998.

[42] T. S. Sidhu, G. S. Sagoo and M. S. Sachdev, "Multi-sensor secondary device for detection of low-level arcing faults in metal-clad MCC switchgear panel," in IEEE Transactions on Power Delivery, vol. 17, no. 1, pp. 129-134, January 2002.

[43] T. S. Sidhu, G. S. Sagoo, and M. S. Sachdev, "On-line detection and location of low-level arcing in dry-type transformers," in IEEE Transactions Power Delivery, vol. 17, no. 1, pp. 135-41, January 2002.

[44] K. Jakob and W. Schels, "A new, intelligent digital arc detection system for air- and gas-insulated switchgear," 14th International Conference and Exhibition on Electricity Distribution, 1997, pp. 1.32.1-1.32.5.

[45] T. Rettenmaier, V. Hinrichsen, A. Lawall, E. D. Taylor and J. Teichmann, "Investigations on contact erosion in vacuum circuit breakers by arc rotation measurements with external magnetic field sensors," 2012 25th International Symposium on Discharges and Electrical Insulation in Vacuum (ISDEIV), 2012, pp. 201-204.

[46] T. Rettenmaier, V. Hinrichsen and E. Taylor, "Investigations on arc movement in vacuum interrupters by arc rotation measurements with external magnetic field sensors," 2014 International Symposium on Discharges and Electrical Insulation in Vacuum (ISDEIV), 2014, pp. 149-152.

[47] M. Prvulovic, A. Zajić, R. L. Callan and C. J. Wang, "A Method for Finding Frequency-Modulated and Amplitude-Modulated Electromagnetic Emanations in Computer Systems," in IEEE Transactions on Electromagnetic Compatibility, vol. 59, no. 1, pp. 34-42, February 2017

[48] Bayens, Christian, et al. "See no evil, hear no evil, feel no evil, print no evil? malicious fill patterns detection in additive manufacturing." 26th USENIX Security Symposium (USENIX Security 17), 2017, pp. 1181-1198

[49] Shekari, Tohid, et al. "RFDIDS: Radio Frequency-based Distributed Intrusion Detection System for the Power Grid." Network and Distributed Systems Security (NDSS), 2019.

[50] M. B. Cohen, R. K. Said, E. W. Paschal, et al. "Broadband longwave radio remote sensing instrumentation," in Review of Scientific Instruments, 89, 094501, 2018.

[41] Slade P G. The vacuum interrupter: theory, design, and application. Boca Raton, CRC press, 2018.

The invention claimed is:

1. An apparatus for gathering magnetic field data associated with at least one circuit breaker connected to a power circuit, the apparatus comprising:

at least one coil antenna positioned in a location relative to the at least one circuit breaker to sense changes in a magnetic field around the coil antenna, wherein the changes in the magnetic field induce corresponding changes to a current and voltage on the coil antenna;

a receiver connected to the at least one coil antenna and receiving the current or the voltage from the coil antenna;

an analog to digital converter receiving the current or the voltage and generating a digital output tracking the changes to the current caused by the magnetic field around the coil antenna; and a computer comprising a processor and computer memory connected to the analog to digital converter and storing the digital output in the computer memory, wherein the computer memory comprises software implemented by the processor to generate a plurality of characteristic magnetic field waveforms of the magnetic field data for the at least one circuit breaker.

2. The apparatus of claim 1, wherein the coil antenna comprises respective wire coils positioned to sense an x, y, or z component of the magnetic field around the coil antenna, wherein the computer generates, in the time domain, a designated waveform signature for a respective x, y, or z component of the magnetic field, and wherein the designated waveform signature comprises the plurality of characteristic magnetic field waveforms.

3. The apparatus of claim 2, wherein the respective x, y, or z component of the magnetic field induces changes to a corresponding current and a corresponding voltage on a respective wire coil according to changes in a power circuit current across the at least one circuit breaker during a load switching operation on the power circuit.

4. The apparatus of claim 1, wherein the plurality of characteristic magnetic field waveforms comprises a spiking waveform, a notch waveform, and a second spiking waveform during a time period corresponding to a load switching operation across the at least one circuit breaker.

5. The apparatus of claim 4, wherein the spiking waveform comprises an increase in the magnetic field around the coil antenna, wherein the increase corresponds to increases in power circuit current across contacts of the at least one circuit breaker in a closed position.

6. The apparatus of claim 4, wherein the notch waveform comprises an increase or a decrease in the magnetic field around the coil antenna corresponding to an electrical arc formation at the at least one circuit breaker upon the at least one circuit breaker opening during the load switching operation.

7. The apparatus of claim 4, wherein the second spiking signature comprises a second increase in the magnetic field around the coil antenna at a determined time after a notch signature time span, wherein the second increase in the magnetic field corresponds to an extinguishment of an electrical arc formed across the at least one circuit breaker upon the circuit breaker opening.

8. The apparatus of claim 1, wherein the at least one coil antenna comprises three orthogonal air-core loop antennas sampling the x, y and z component of the magnetic field.

9. The apparatus of claim 1, wherein the computer and the software are configured to distinguish respective waveform signatures of the magnetic field data for individual circuit breakers according to the relative locations of the at least one coil antenna and the individual circuit breakers.

10. A system of tracking load switching operations and fault clearing operations of at least one circuit breaker in a power circuit, the system comprising:

at least one coil antenna in proximity to the at least one circuit breaker for sensing changes in a magnetic field around the at least one coil antenna, wherein the changes in the magnetic field correspond to load switching operations and fault clearing operations at the at least one circuit breaker and induce corresponding changes to a current and a voltage in the at least one coil antenna;

a receiver connected to the at least one coil antenna and receiving the current or the voltage;

a computer comprising a processor and computer memory connected to the receiver and storing a data stream in the computer memory that corresponds to the changes in magnetic field around the at least one coil antenna, wherein the computer memory comprises software, implemented by the processor, configured to use the data stream to generate a plurality of characteristic magnetic field waveforms for the at least one circuit breaker, and wherein the software assembles a low frequency magnetic signature for a respective circuit breaker from the characteristic magnetic field waveforms generated for the respective circuit breaker.

11. The system of claim 10, wherein the computer distinguishes the signature waveform for the respective circuit breaker by the respective locations of the at least one coil antenna and the respective circuit breaker.

12. The system of claim 10, wherein the plurality of characteristic magnetic field waveforms comprises a spiking waveform, a notch waveform, and a second spiking waveform during a time period corresponding to a load switching operation across the at least one circuit breaker.

13. The system of claim 12, wherein the time period comprises a start time initiating the spiking waveform, wherein the start time corresponds to an increase, from zero, in a sensed magnetic field around the coil antenna, and wherein the increase in the magnetic field results from a respective increase in power circuit current across the respective circuit breaker in a closed position.

14. The system of claim 13, wherein the spiking waveform terminates when the magnetic field drops from a spiking maximum value to a local minimum value for the spiking waveform.

15. The system according to claim 12, wherein the time period comprises a contact separation time initiating the notch waveform, wherein the contact separation time corresponds to an increase or a decrease in the magnetic field around the coil antenna from the local minimum value of the spiking waveform to a different value corresponding to an electrical arc formed at the respective circuit breaker upon the respective circuit breaker opening during the load switching operation.

16. The system according to claim 15, wherein the notch waveform terminates when the change in the magnetic field drops to a local minimum value in magnitude for the notch waveform.

17. The system according to claim 16, wherein the time period comprises an end time initiating the second spiking waveform, wherein the end time corresponds to a change back to zero in the magnetic field around the coil antenna from the local minimum value of the notch waveform, corresponding to extinction of the electrical arc at the respective circuit breaker upon the respective circuit breaker remaining open during the load switching operation.

18. The system according to claim 15, wherein the second spiking waveform terminates when a sensed magnetic field around the coil antenna increases from zero.

19. A computer implemented method of tracking load switching operations or fault clearing operations of at least one circuit breaker in a power circuit, the method comprising:

positioning at least one coil antenna in proximity to the at least one circuit breaker;

sensing changes in a magnetic field around the at least one coil antenna, wherein the changes in the magnetic field correspond to the load switching operations at the at least one circuit breaker and induce corresponding changes to a current or a voltage in the at least one coil antenna;

transmitting the current or the voltage from the at least one coil antenna to a receiver;

converting the current or the voltage that is input from the at least one coil antenna to a magnetic field data stream tracking the magnetic field in the time domain;

using a computer comprising a processor and computer memory to:

store the data stream in the computer memory; and generate a plurality of characteristic magnetic field waveforms for the at least one circuit breaker.

20. The computer implemented method of claim 19, further comprising assembling a low frequency magnetic signature for a respective circuit breaker from the characteristic magnetic field waveforms generated for the respective circuit breaker.

21. The computer implemented method of claim 20, further comprising assembling characteristic magnetic field waveforms for a spiking waveform, a notch waveform, and a second spiking waveform during a time period corresponding to the load switching operation across the respective circuit breaker.

22. The computer implemented method of claim 21, wherein the time period comprises a start time initiating the spiking waveform, and the computer triggers the start time upon an increase, from zero, in a sensed magnetic field around the coil antenna, and wherein the increase in the magnetic field results from a respective increase in power circuit current across the respective circuit breaker in a closed position.

23. The computer implemented method of claim 22, wherein the computer terminates the spiking waveform when the magnetic field drops from a spiking maximum value to a local minimum value for the spiking waveform.

24. The computer implemented method of claim 21, wherein the time period comprises a contact separation time initiating the notch waveform, wherein the computer triggers the contact separation time upon an increase or a decrease in the magnetic field around the coil antenna from the local minimum value of the spiking waveform to a different value corresponding to an electrical arc formed at the respective circuit breaker upon the respective circuit breaker opening during the load switching operation.

25. The computer implemented method of claim 24, wherein the computer terminates the notch waveform when the magnetic field drops to a local minimum value for the notch waveform.

* * * * *